United States Patent
Loh et al.

(10) Patent No.: US 12,218,012 B2
(45) Date of Patent: *Feb. 4, 2025

(54) METHOD OF MANUFACTURING SEMICONDUCTOR DEVICES WITH MULTIPLE SILICIDE REGIONS

(71) Applicant: Taiwan Semiconductor Manufacturing Co., Ltd., Hsinchu (TW)

(72) Inventors: Wei-Yip Loh, Hsinchu (TW); Yan-Ming Tsai, Toufen Township (TW); Hung-Hsu Chen, Tainan (TW); Chih-Wei Chang, Hsinchu (TW); Sheng-Hsuan Lin, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/360,478

(22) Filed: Jul. 27, 2023

(65) Prior Publication Data

US 2023/0369130 A1 Nov. 16, 2023

Related U.S. Application Data

(60) Continuation of application No. 17/827,355, filed on May 27, 2022, now Pat. No. 11,810,826, which is a (Continued)

(51) Int. Cl.
*H01L 21/8238* (2006.01)
*H01L 21/285* (2006.01)
(Continued)

(52) U.S. Cl.
CPC .......... *H01L 21/823814* (2013.01); *H01L 21/28518* (2013.01); *H01L 27/0924* (2013.01);
(Continued)

(58) Field of Classification Search
CPC ....... H01L 21/523814; H01L 21/28518; H01L 21/266; H01L 21/3065; H01L 21/31053;
(Continued)

(56) References Cited

U.S. PATENT DOCUMENTS

| 4,803,539 A | 2/1989 | Psaras et al. |
| 9,093,566 B2 | 7/2015 | Fan et al. |

(Continued)

FOREIGN PATENT DOCUMENTS

| KR | 20180051845 A | 5/2018 |
| TW | 201133627 A | 10/2011 |

(Continued)

OTHER PUBLICATIONS

Demeulemeester, J., et al., "The influence of Pt redistribution on Ni1-xPtxSi growth properties," J. Appl. Phys. 108, 043505 (2010), https://doi.org/10.1063/1.3455873, Aug. 18, 2010, 12 pages.

(Continued)

*Primary Examiner* — Lex H Malsawma
(74) *Attorney, Agent, or Firm* — Slater Matsil, LLP

(57) ABSTRACT

A semiconductor device with multiple silicide regions is provided. In embodiments a first silicide precursor and a second silicide precursor are deposited on a source/drain region. A first silicide with a first phase is formed, and the second silicide precursor is insoluble within the first phase of the first silicide. The first phase of the first silicide is modified to a second phase of the first silicide, and the second silicide precursor being soluble within the second phase of the first silicide. A second silicide is formed with the second silicide precursor and the second phase of the first silicide.

20 Claims, 26 Drawing Sheets

Related U.S. Application Data division of application No. 16/527,350, filed on Jul. 31, 2019, now Pat. No. 11,348,839.

(51) Int. Cl.
  *H01L 27/092* (2006.01)
  *H01L 29/08* (2006.01)
  *H01L 29/45* (2006.01)
  *H01L 29/66* (2006.01)
  *H01L 21/266* (2006.01)
  *H01L 21/3065* (2006.01)
  *H01L 21/3105* (2006.01)
  *H01L 21/311* (2006.01)
  *H01L 21/3213* (2006.01)
  *H01L 21/762* (2006.01)
  *H01L 29/78* (2006.01)

(52) U.S. Cl.
  CPC .......... *H01L 29/0847* (2013.01); *H01L 29/45* (2013.01); *H01L 29/665* (2013.01); *H01L 21/266* (2013.01); *H01L 21/3065* (2013.01); *H01L 21/31053* (2013.01); *H01L 21/31111* (2013.01); *H01L 21/32135* (2013.01); *H01L 21/76224* (2013.01); *H01L 21/823821* (2013.01); *H01L 21/823828* (2013.01); *H01L 21/823864* (2013.01); *H01L 21/823878* (2013.01); *H01L 29/66545* (2013.01); *H01L 29/66636* (2013.01); *H01L 29/7848* (2013.01)

(58) Field of Classification Search
  CPC ......... H01L 21/31111; H01L 21/32135; H01L 21/76224; H01L 21/823821; H01L 21/823828; H01L 21/823864; H01L 21/823878; H01L 27/0924; H01L 29/0847; H01L 29/45; H01L 29/665
  See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,026,628 B2 | 7/2018 | Ogawa et al. |
| 11,348,839 B2 * | 5/2022 | Loh .................. H01L 29/45 |
| 2005/0176227 A1 | 8/2005 | Wu et al. |
| 2006/0138562 A1 | 6/2006 | Okuno et al. |
| 2006/0163670 A1 | 7/2006 | Ellis-Monaghan et al. |
| 2007/0123042 A1 | 5/2007 | Rim et al. |
| 2009/0152652 A1 | 6/2009 | Nishi et al. |
| 2011/0237061 A1 * | 9/2011 | Yamaguchi ....... H01L 21/67748 |
| | | 257/E21.158 |
| 2012/0126297 A1 | 5/2012 | Yamaguchi |
| 2013/0122670 A1 | 5/2013 | Duong et al. |
| 2013/0234335 A1 | 9/2013 | Fitz et al. |
| 2013/0256808 A1 | 10/2013 | Yin et al. |
| 2013/0277769 A1 | 10/2013 | Tung et al. |
| 2014/0073130 A1 | 3/2014 | Hilscher et al. |
| 2014/0106529 A1 | 4/2014 | Morin et al. |
| 2014/0191298 A1 | 7/2014 | Chen et al. |
| 2014/0191301 A1 | 7/2014 | He et al. |
| 2017/0098606 A1 | 4/2017 | Lu et al. |
| 2017/0148739 A1 | 5/2017 | Roberts et al. |
| 2017/0338321 A1 | 11/2017 | Hurwitz et al. |
| 2018/0130886 A1 | 5/2018 | Kim et al. |

FOREIGN PATENT DOCUMENTS

| | | |
|---|---|---|
| TW | 201426846 A | 7/2014 |
| TW | 201428975 A | 7/2014 |
| TW | 201611133 A | 3/2016 |
| TW | 201707151 A | 2/2017 |
| TW | 201731022 A | 9/2017 |

OTHER PUBLICATIONS

Hoummada K., et al., "Effect of Pt addition on Ni silicide formation at low temperature: Growth, redistribution, and solubility," Journal of Applied Physics 106, 063511 (2009), Sep. 21, 2009, 10 pages.

Kim, J., et al., "Chemically Homogeneous and Thermally Robust Ni1-xPtxSi Film Formed Under a Non-Equilibrium Melting/Quenching Condition," ACS Applied Materials & Interfaces 2017, vol. 9, Dec. 15, 2016, pp. 566-572.

Schrauwen, A., et al., "Ternary silicide formation from Ni—Pt, Ni—Pd and Pt—Pd alloys on Si(100): Nucleation and solid solubility of the monosilicides," Acta Materialia, vol. 130 (2017), Mar. 18, 2017, pp. 19-27.

* cited by examiner

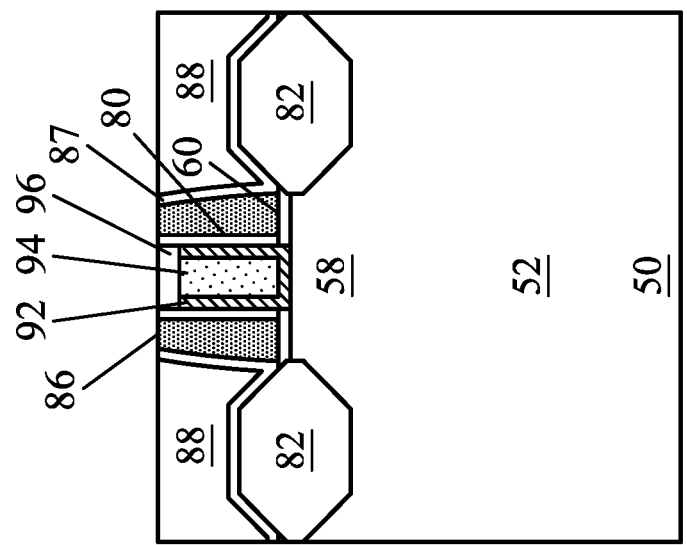
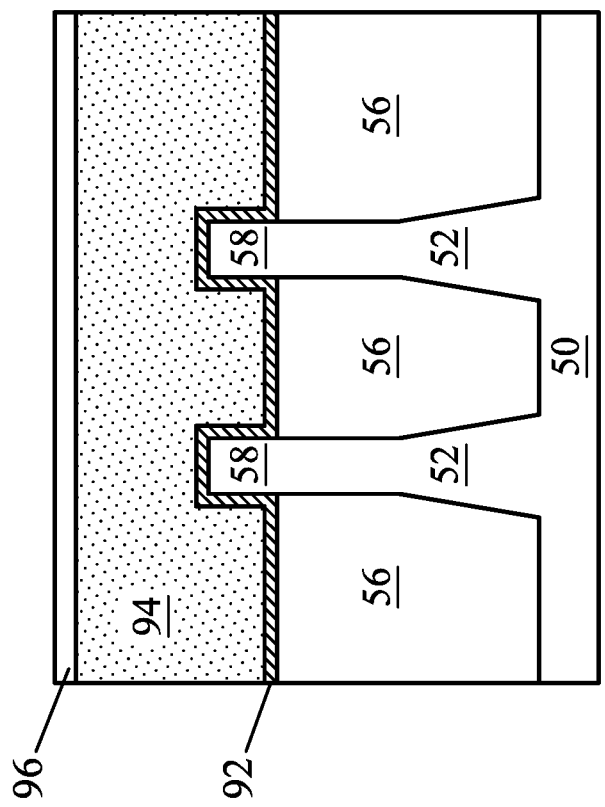
Figure 15B
Figure 15A

US 12,218,012 B2

METHOD OF MANUFACTURING SEMICONDUCTOR DEVICES WITH MULTIPLE SILICIDE REGIONS

PRIORITY CLAIM AND CROSS-REFERENCE

This application is a continuation of U.S. patent application Ser. No. 17/827,355, filed on May 27, 2022, entitled "Method of Manufacturing Semiconductor Devices with Multiple Silicide Regions," which application is a divisional of U.S. patent application Ser. No. 16/527,350, filed on Jul. 31, 2019, entitled "Method of Manufacturing Semiconductor Devices with Multiple Silicide Regions," now U.S. Pat. No. 11,348,839, issued on May 31, 2022, which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 11A, 11B, 11C, 12A, 12B, 13A, 13B, 14A, 14B, 14C, 15A, 15B, 16A, and 16B are cross-sectional views of intermediate stages in the manufacturing of FinFETs, in accordance with some embodiments.

DETAILED DESCRIPTION

Figure 1:
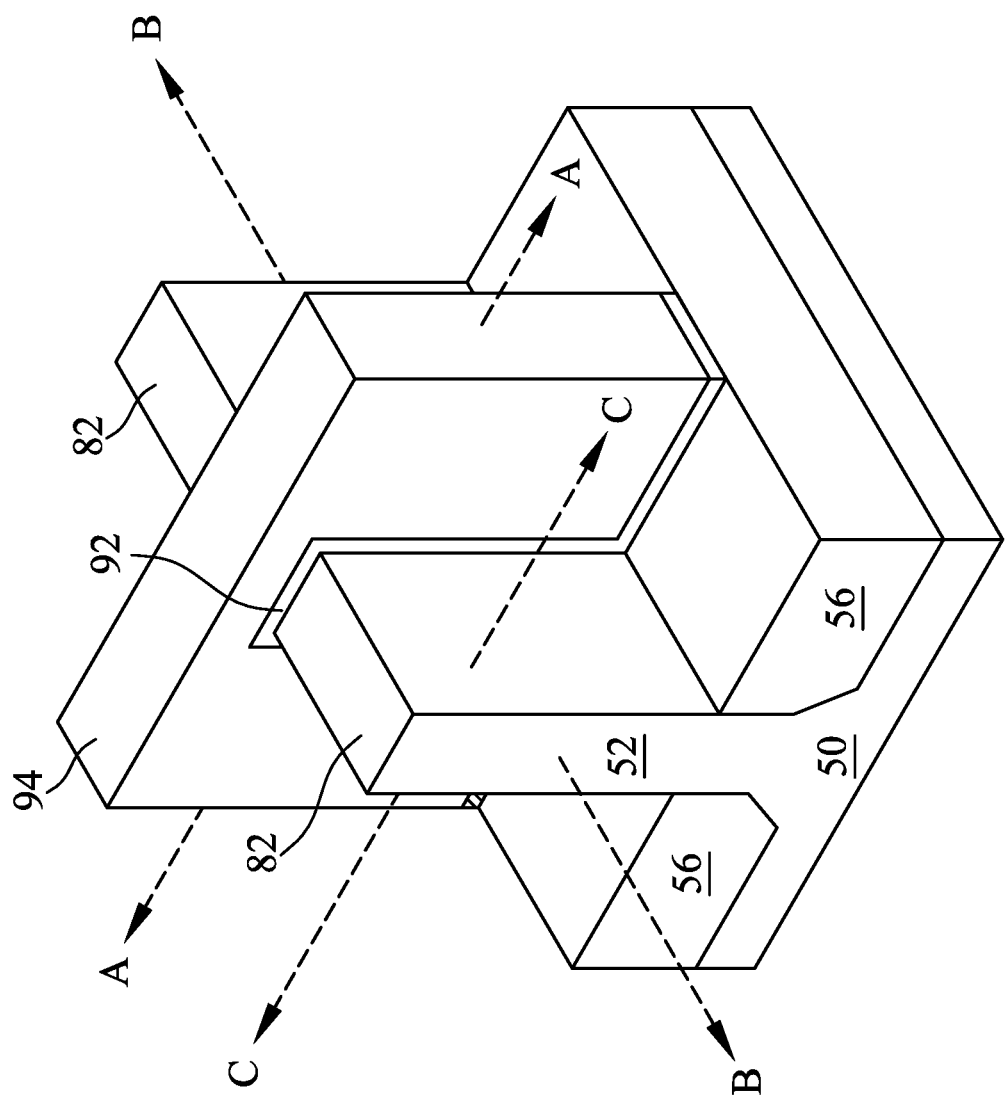
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to specific embodiments in which segregated silicide regions are formed using a single process. However, the embodiments described herein are fully intended to be illustrative and are not intended to be limiting to those descriptions found herein.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A and 17A are illustrated along reference cross-section A-A illustrated in FIG. 1, and FIGS. 8B, 9B, 10B, 11B, 12B, 13B, 14B, 14C, 15B, 16B and 17B are illustrated along a similar cross-section B-B illustrated in FIG. 1, except for multiple fins/FinFETs. FIG. 10C is illustrated along reference cross-section C-C illustrated in FIG. 1, except for multiple fins/FinFETs.

Figure 2:
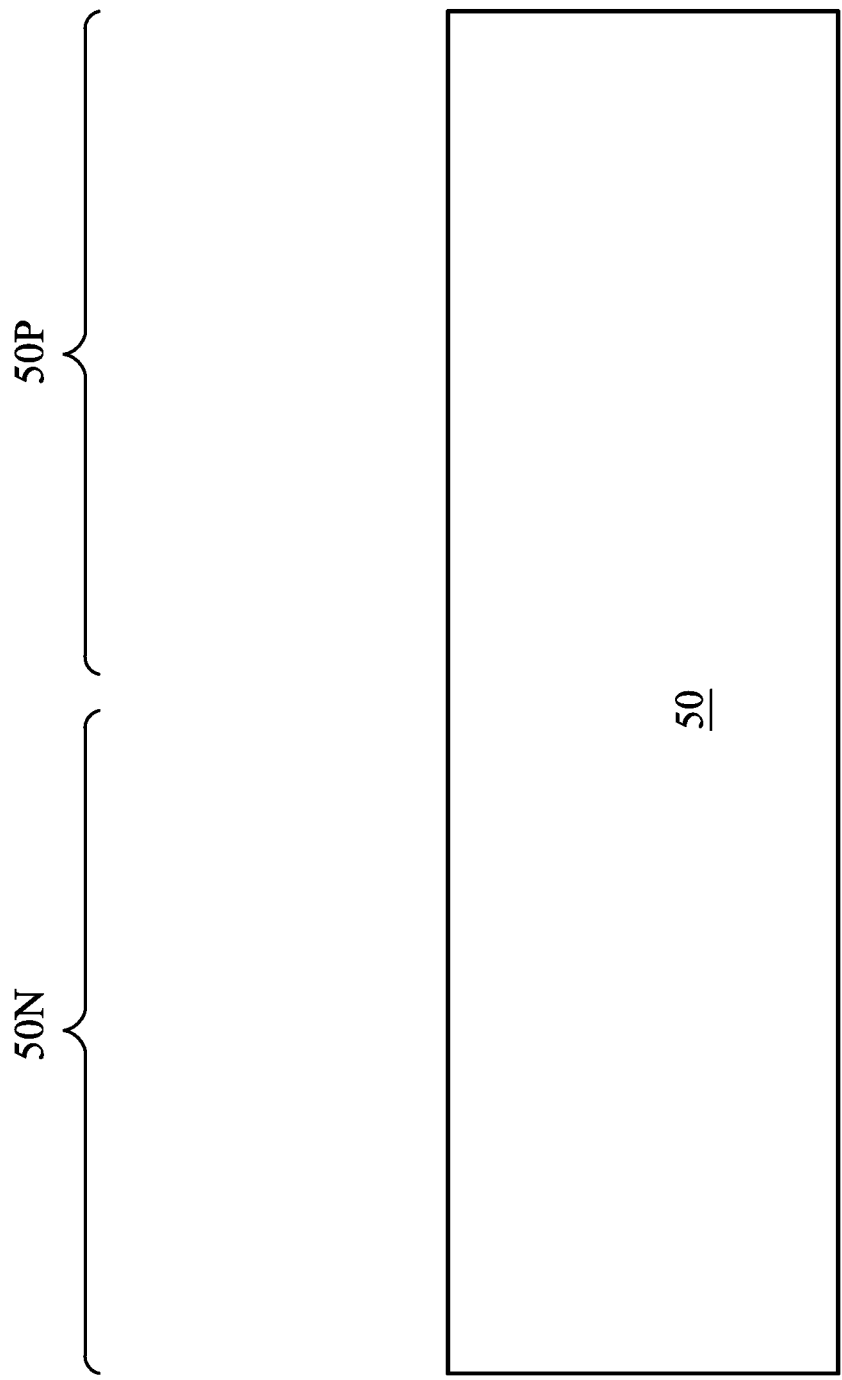

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (such as a divider), and any number of device features (e.g., other active devices, doped regions, isolation structures, etc.) may be disposed between the region 50N and the region 50P.

Figure 3:
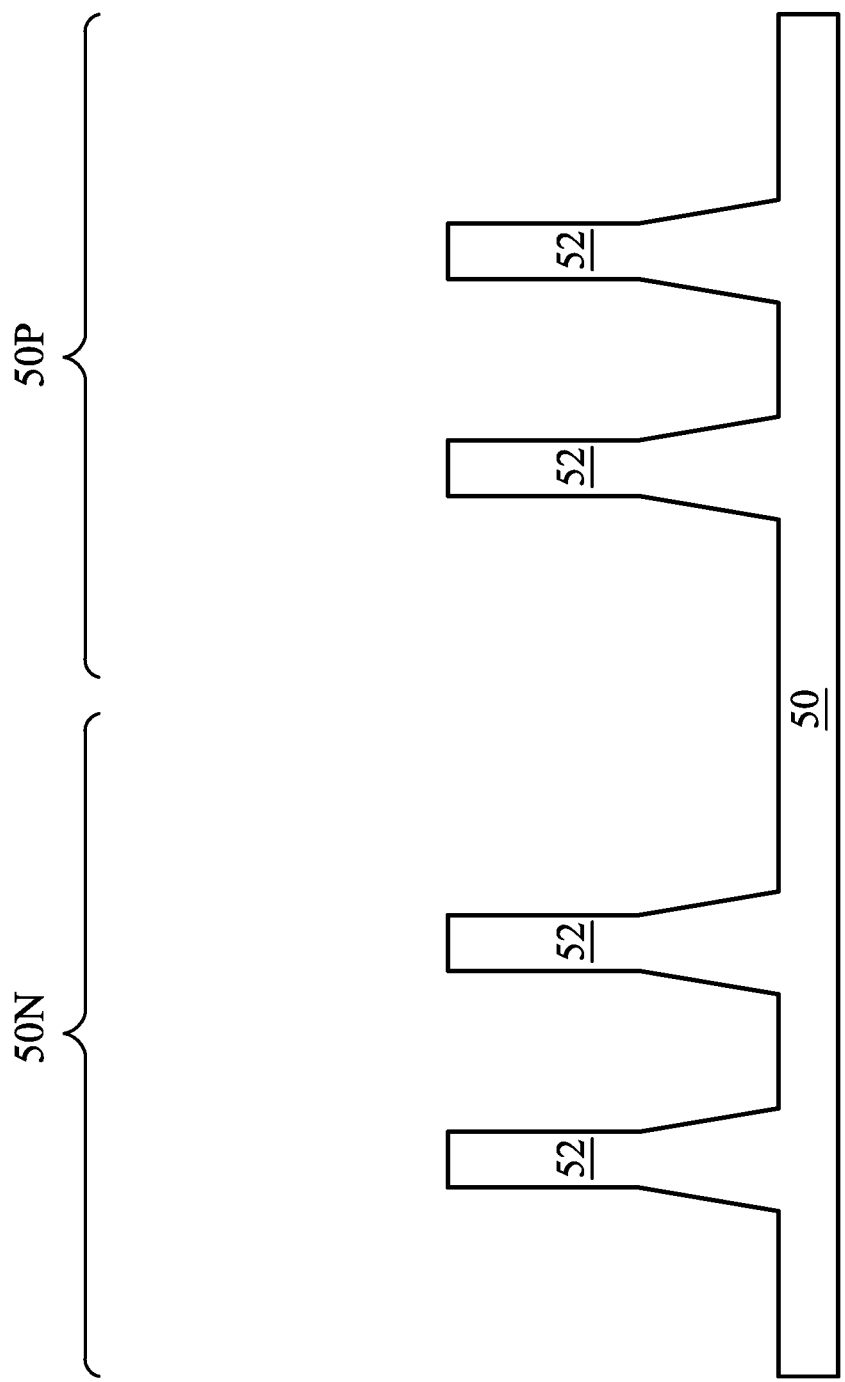

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
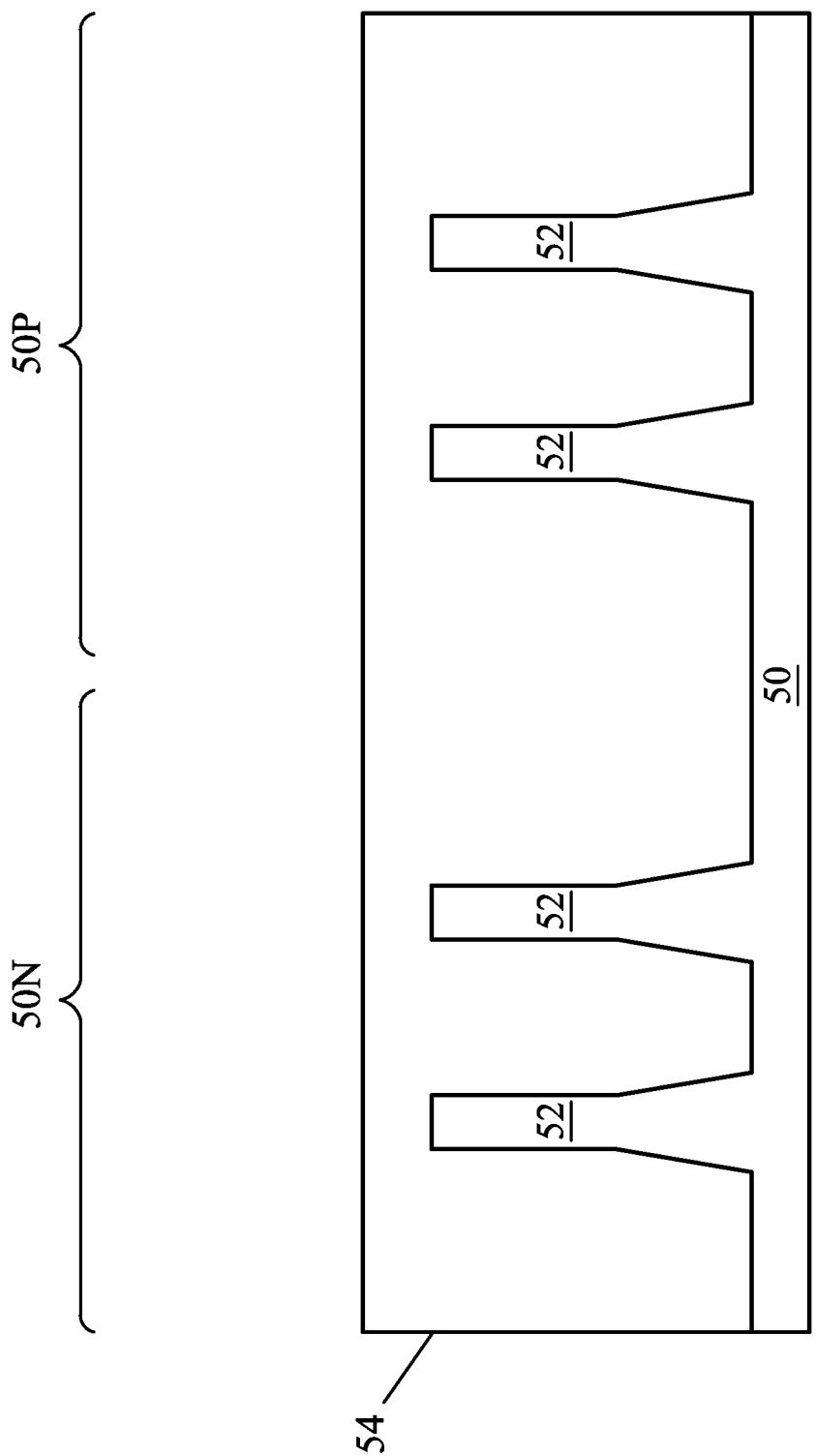

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
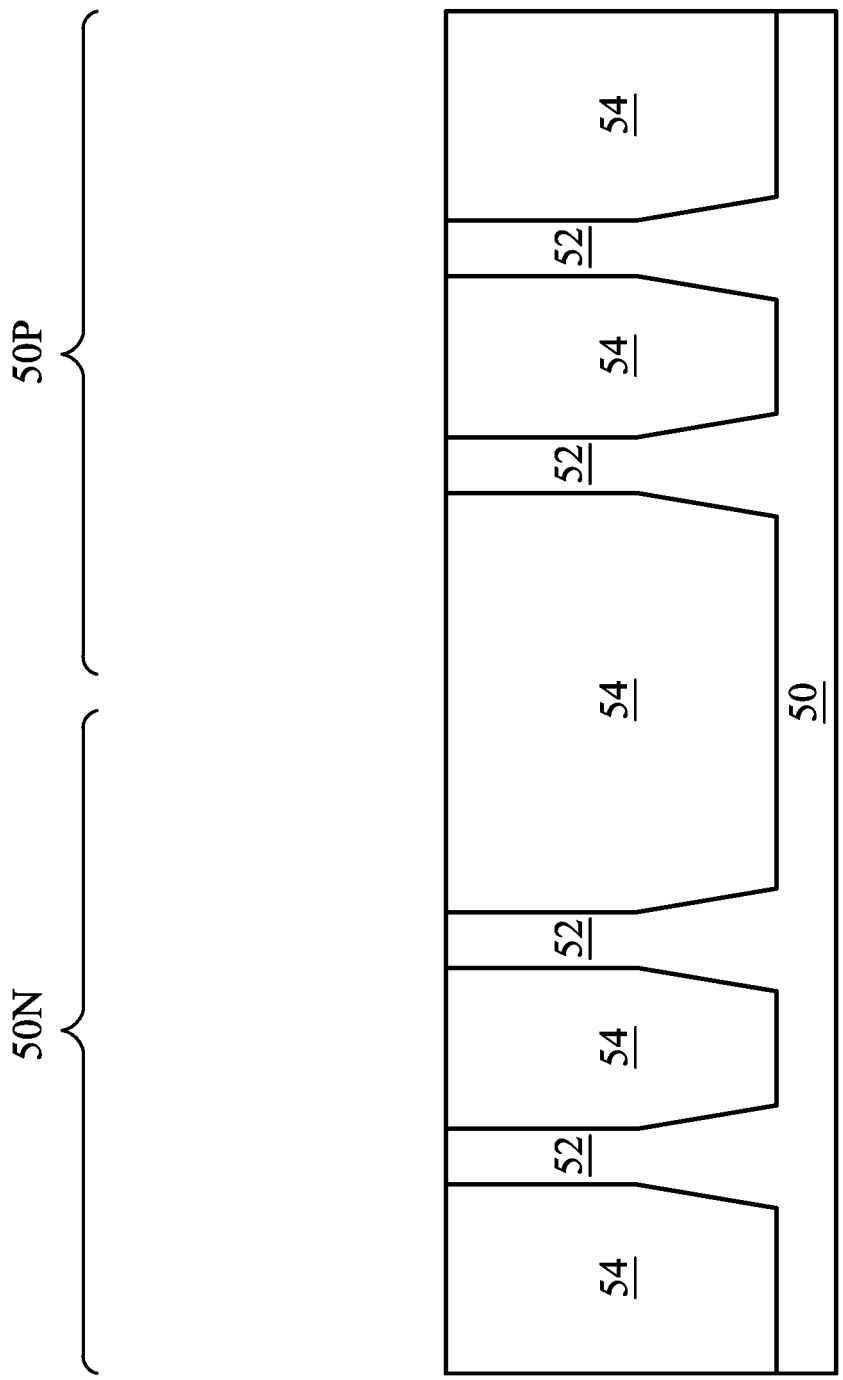

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
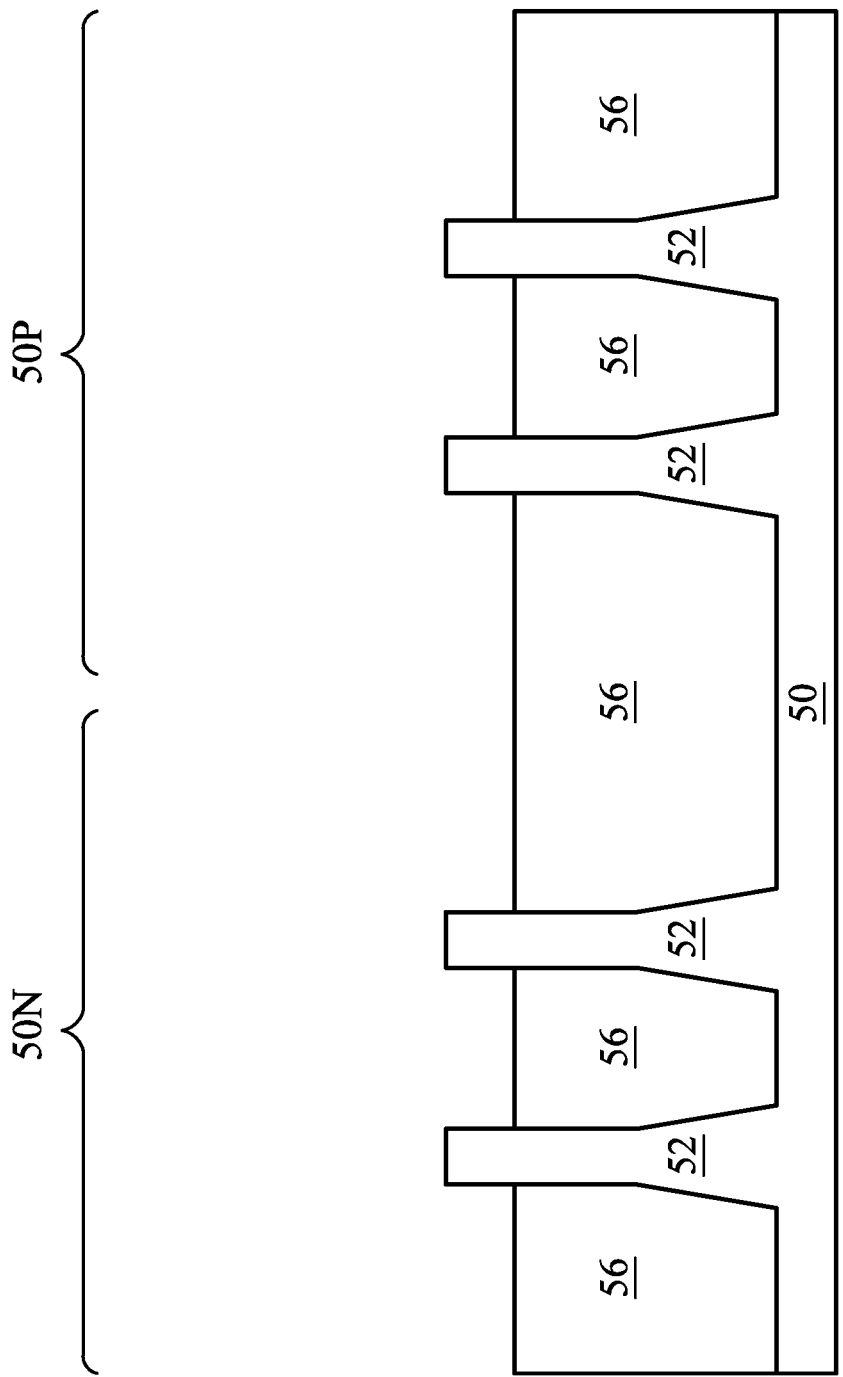

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
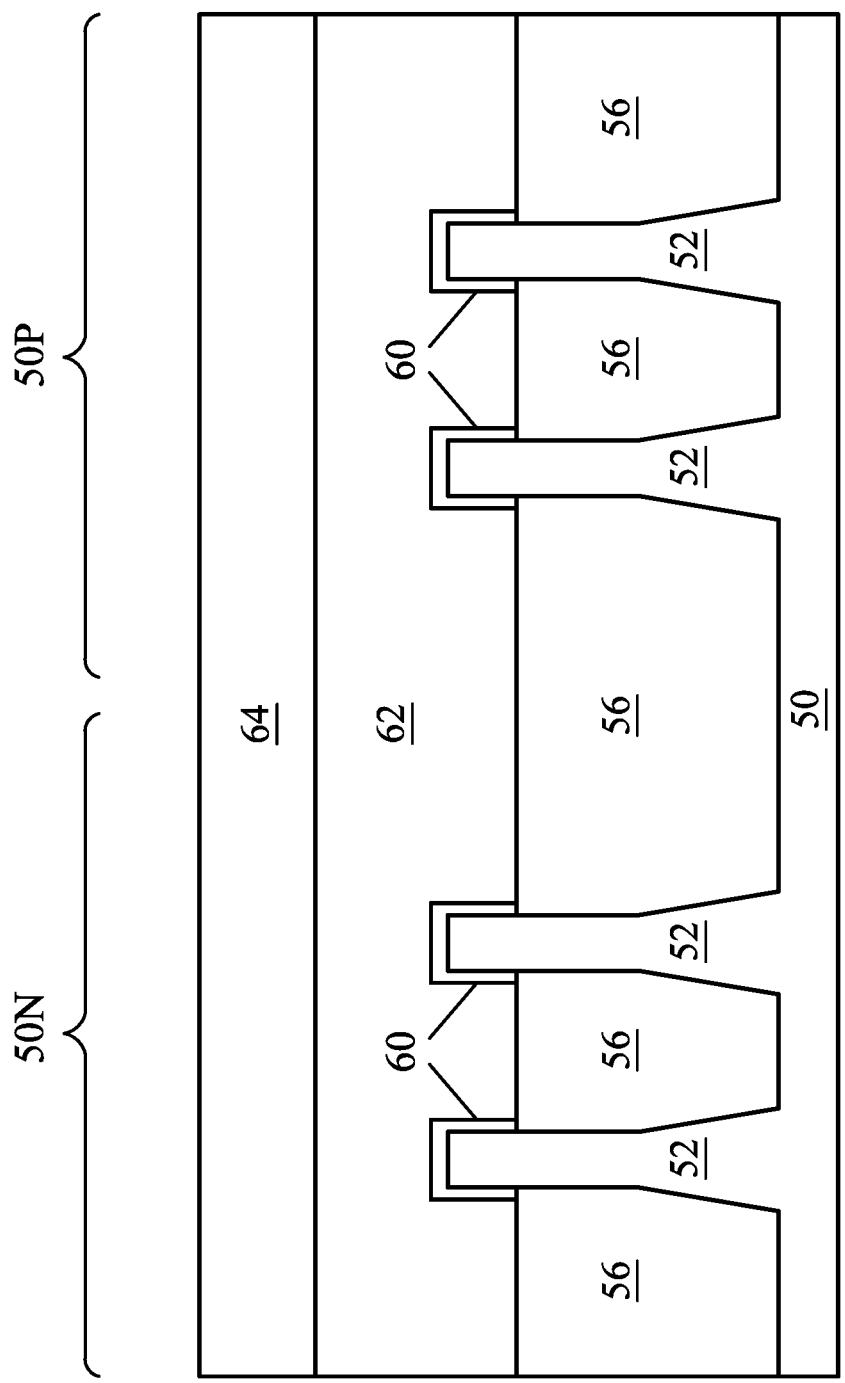

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
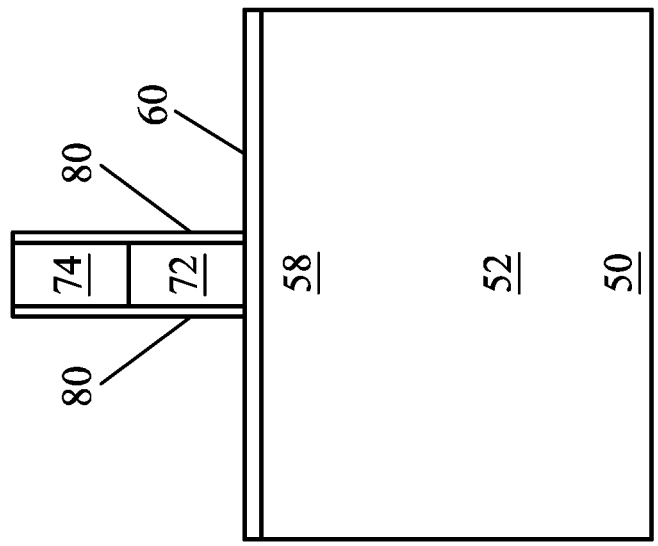
Figure 8A:
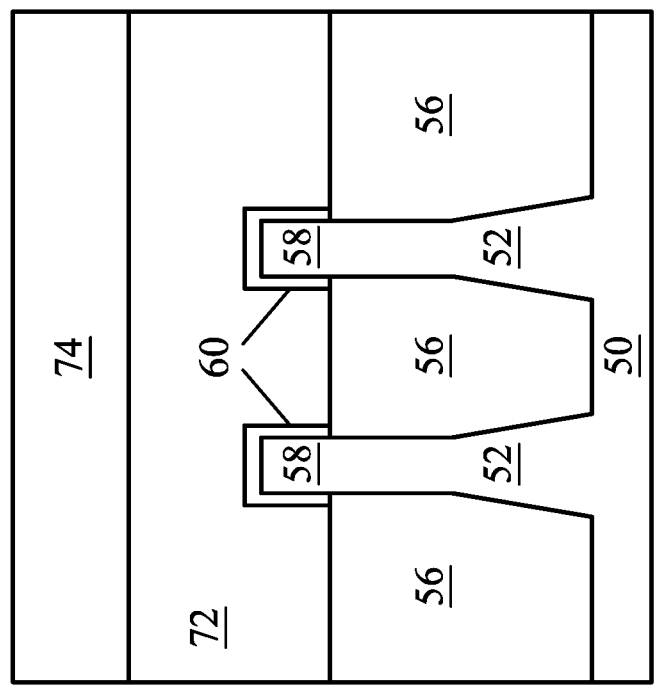

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
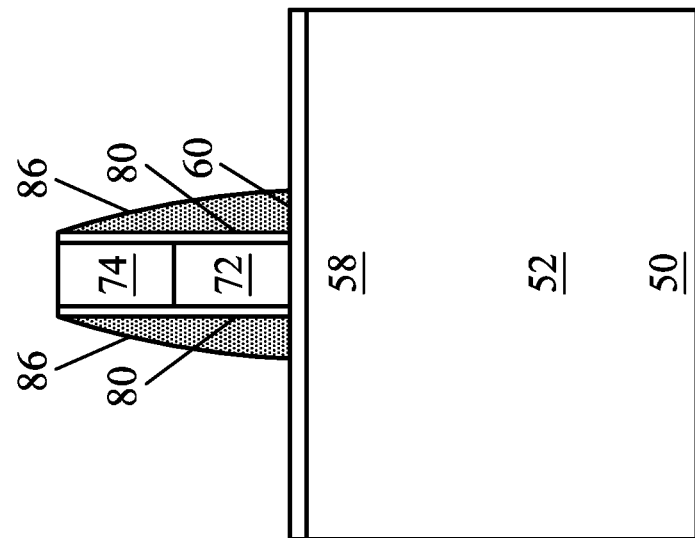
Figure 9A:
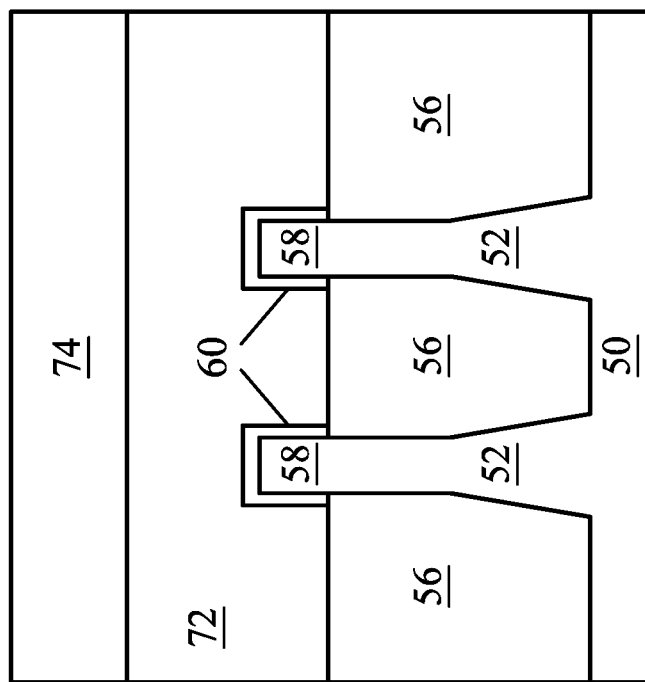

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
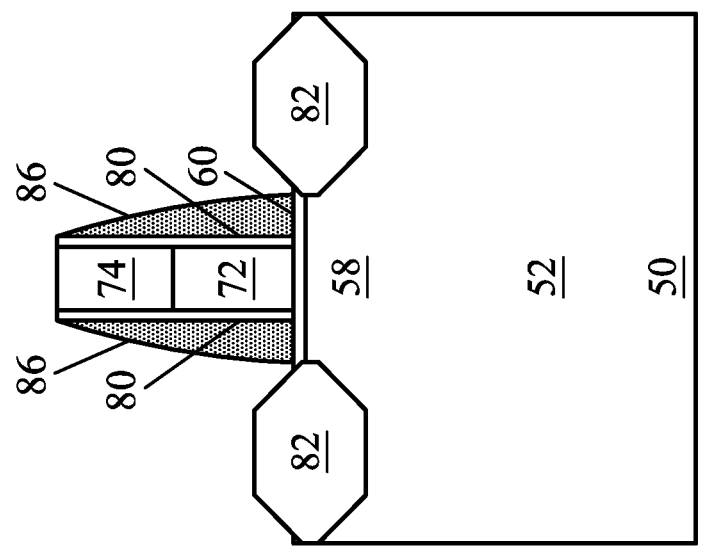
Figure 10A:
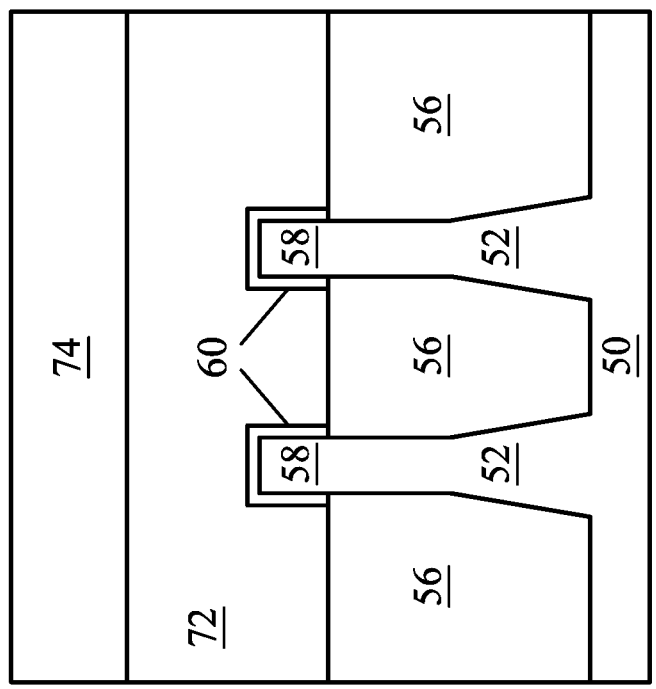
Figure 10C:
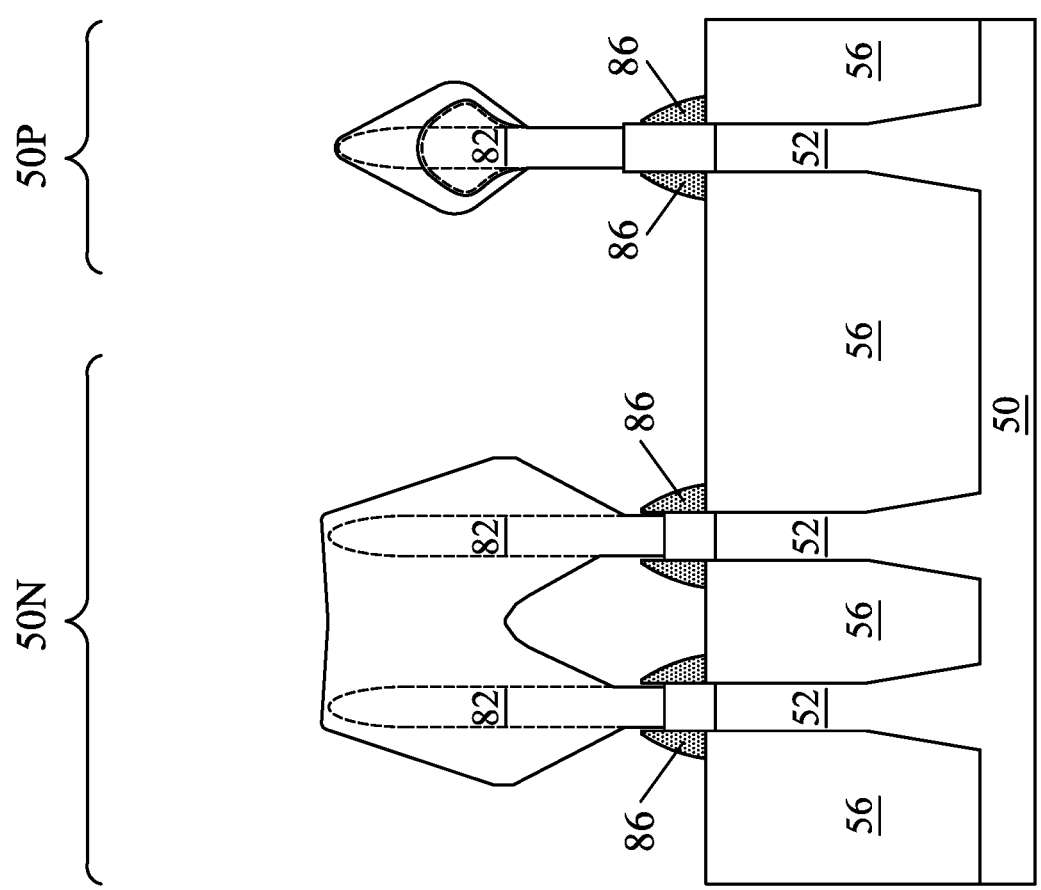

In FIGS. 10A, 10B and 10C epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials such as silicon or materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated within region 50N of FIG. 10C. In other embodiments, adjacent source/drain regions 82 remain separated after the epitaxy process is completed as illustrated within region 50P of FIG. 10C. In the embodiments illustrated in FIG. 10C, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
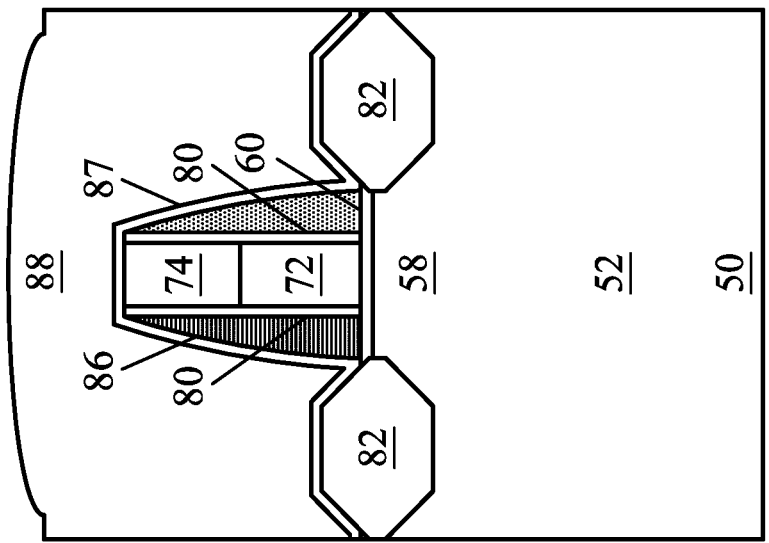
Figure 11A:
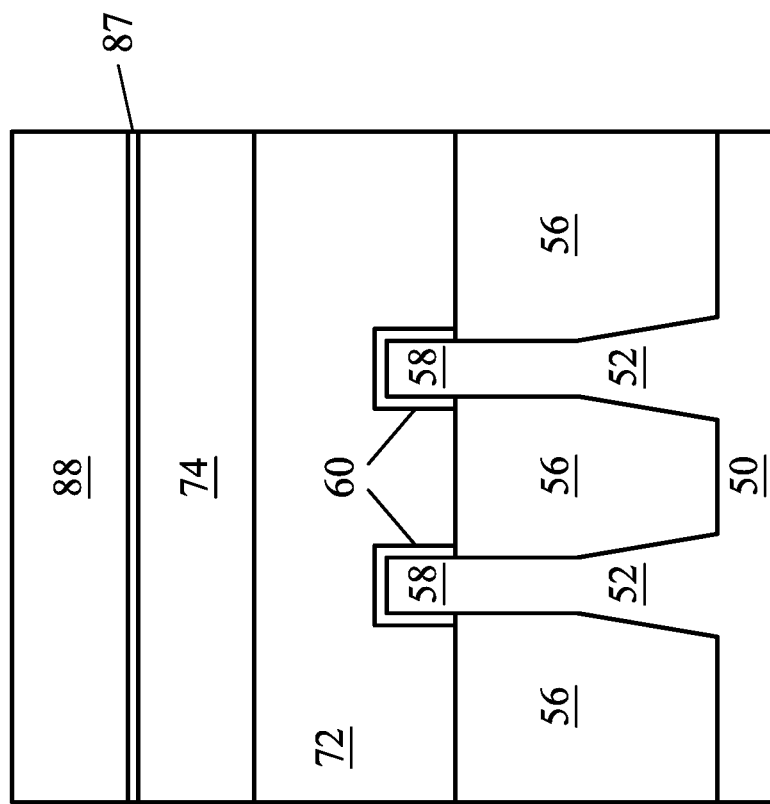
Figure 11C:
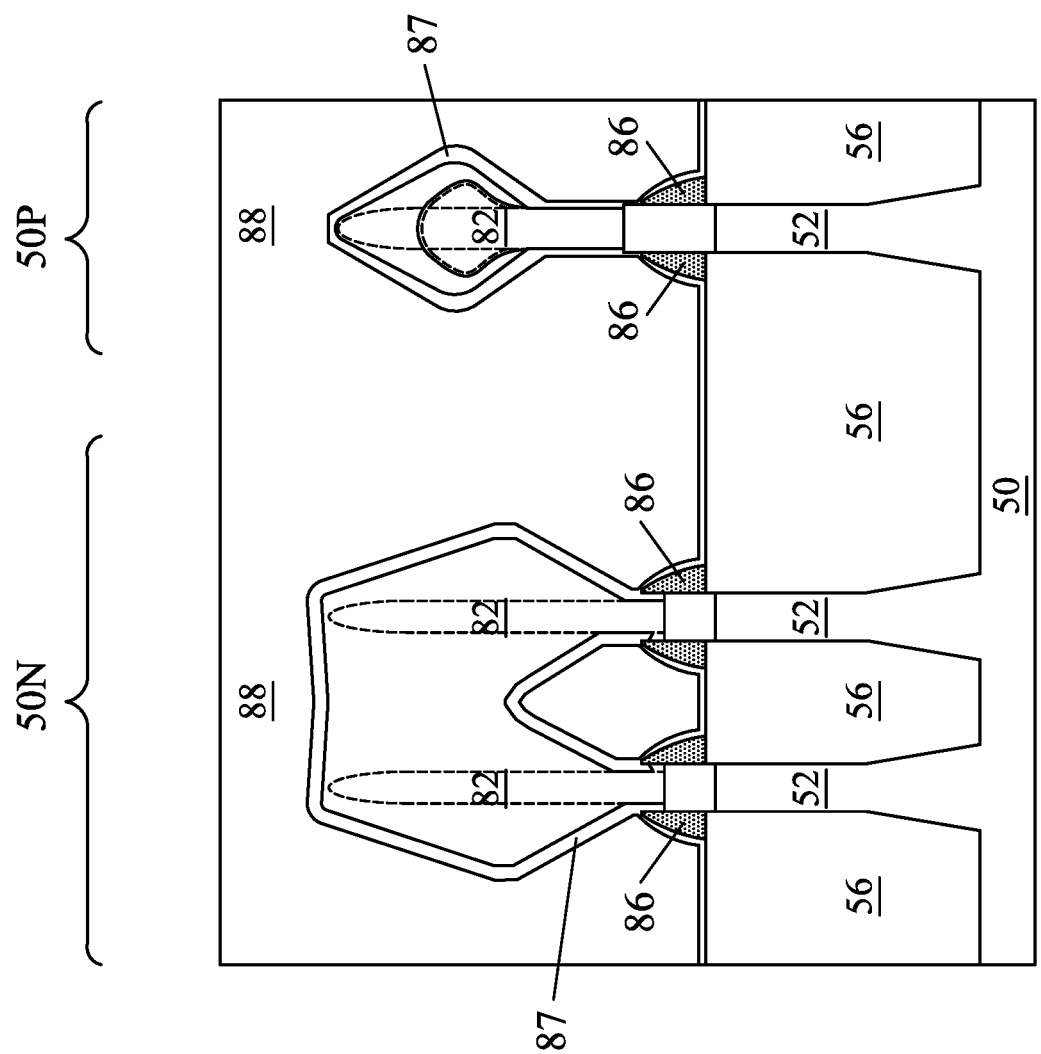

In FIGS. 11A, 11B and 11C, a first interlayer dielectric (ILD) 88 is deposited over the structure illustrated in FIGS. 10A, 10B, and 10C. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
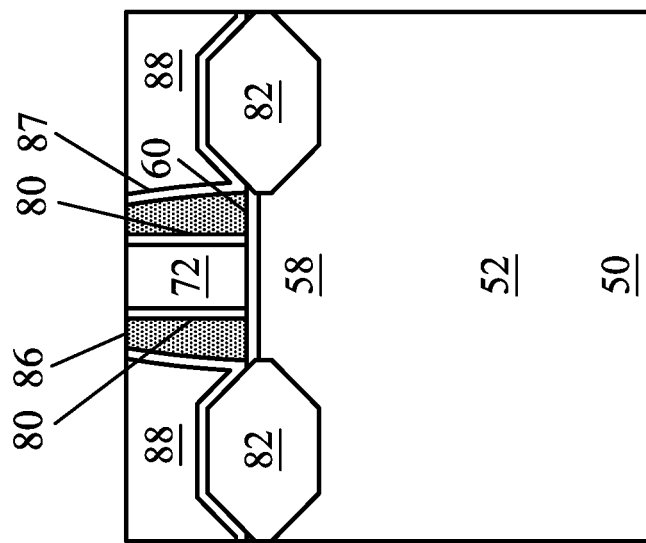
Figure 12A:
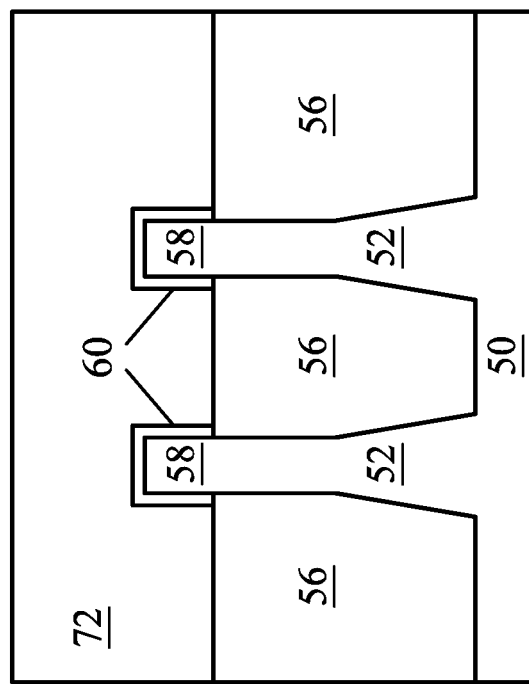

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 13B:
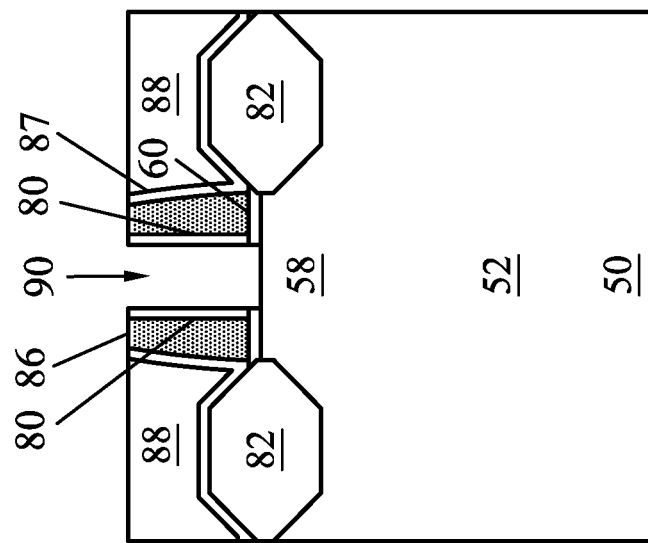
Figure 13A:
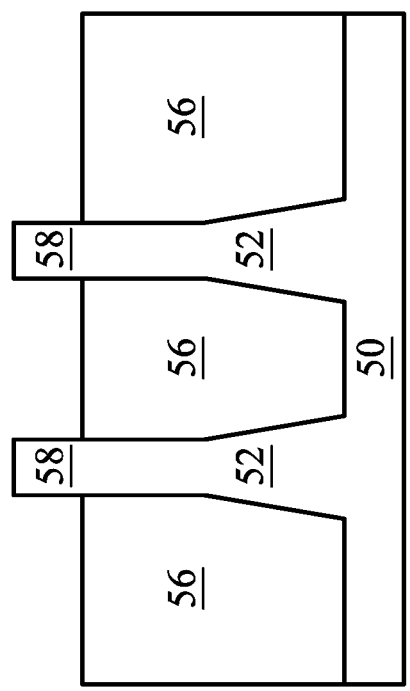

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
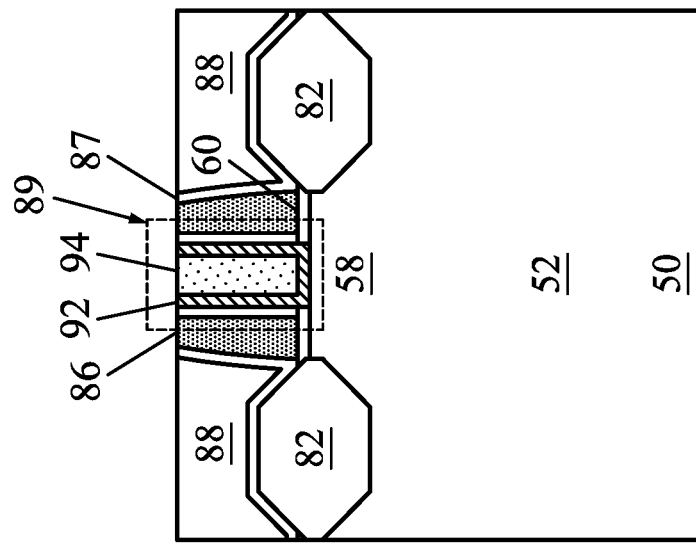
Figure 14A:
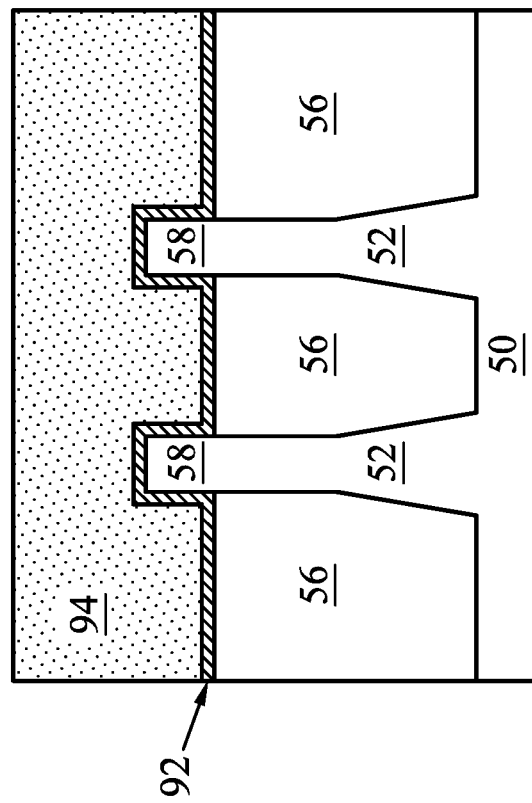
Figure 14C:
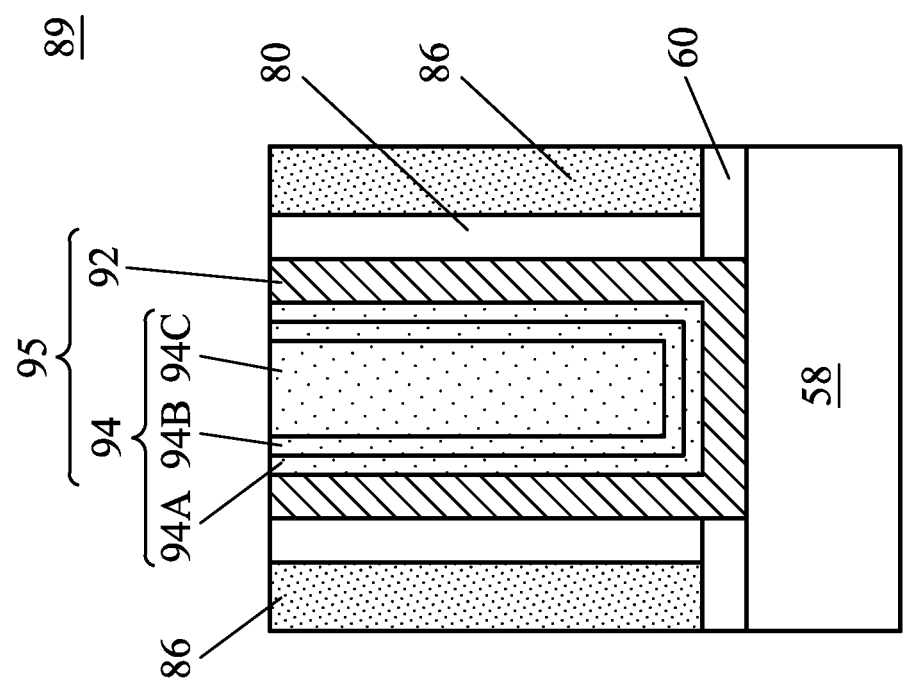

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks 95 may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 15A and 15B, the gate stack (including a gate dielectric layer 92 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 233 (FIGS. 21A and 21B) penetrate through the gate mask 96 to contact the top surface of the recessed gate electrode 94.

Figures 16A, 16B:
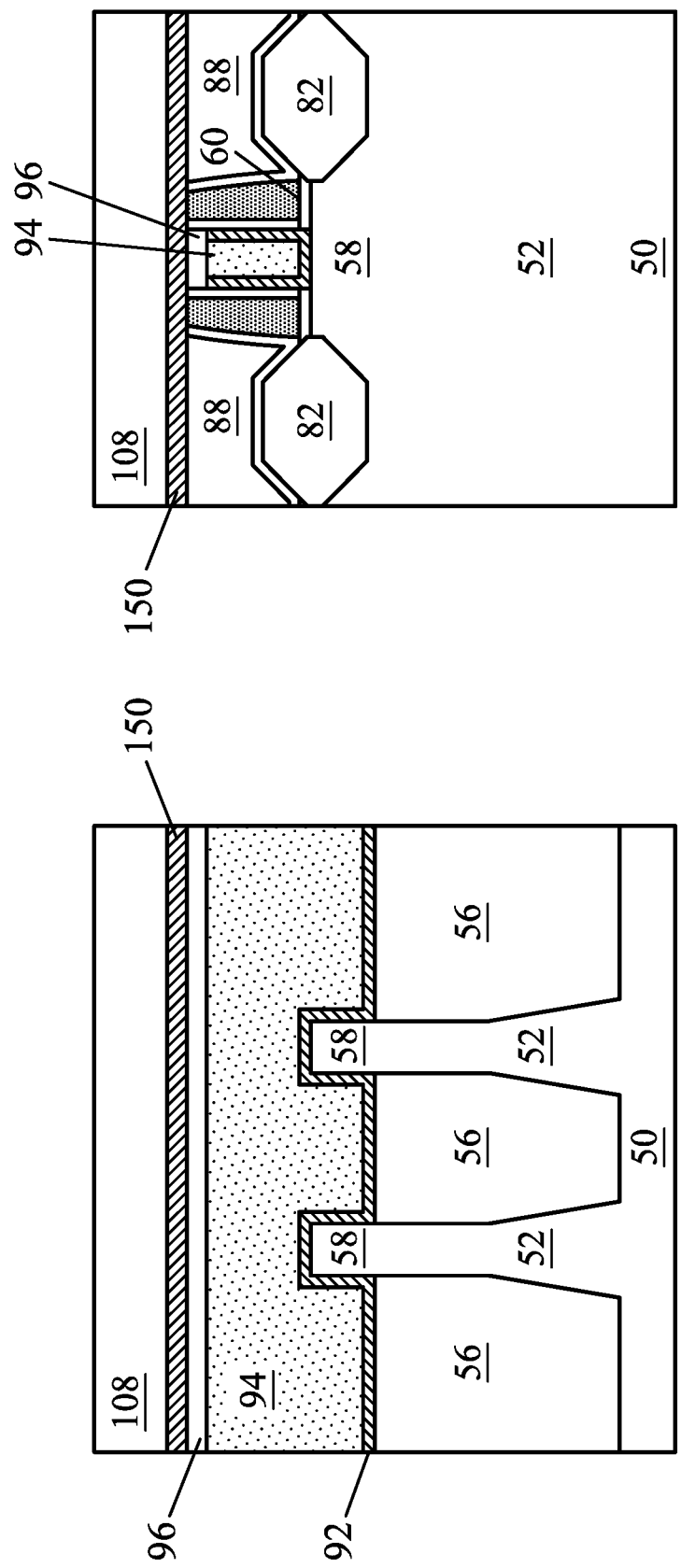

In FIGS. 16A-16C, a second ILD 108 is deposited over the first ILD 88 with an etch stop 150 formed between the second ILD 108 and the first ILD 88. In an embodiment the etch stop 150 may be formed of a dielectric material such as silicon nitride deposited through a process such as plasma enhanced chemical vapor deposition (PECVD), physical vapor deposition (PVD) atomic layer deposition (ALD), low pressure chemical vapor deposition (LPCVD), spin-on coating, or the like. However, any suitable material and process may be utilized.

Additionally, the second ILD 108 may be a flowable film formed by a flowable CVD method. In some embodiments, the second ILD 108 is formed of a dielectric material such as PSG, BSG, BPSG, USG, or the like, and may be deposited by any suitable method, such as CVD and PECVD. However, any suitable material or method of manufacture may be utilized.

Figures 17A, 17B:
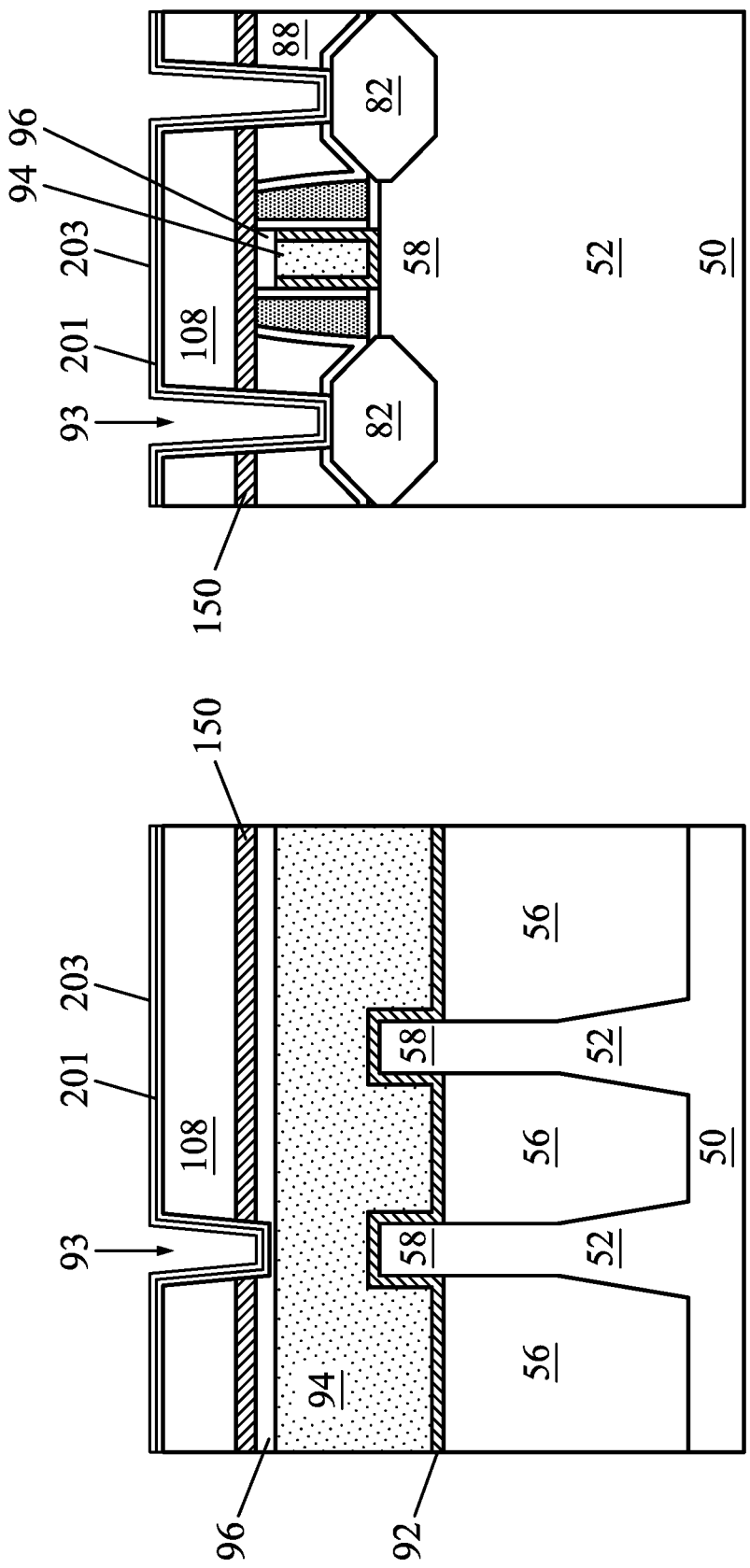
FIGS. 17A-17C illustrate deposition of a first dual material silicide precursor layer in accordance with some embodiments.
Figure 17C:
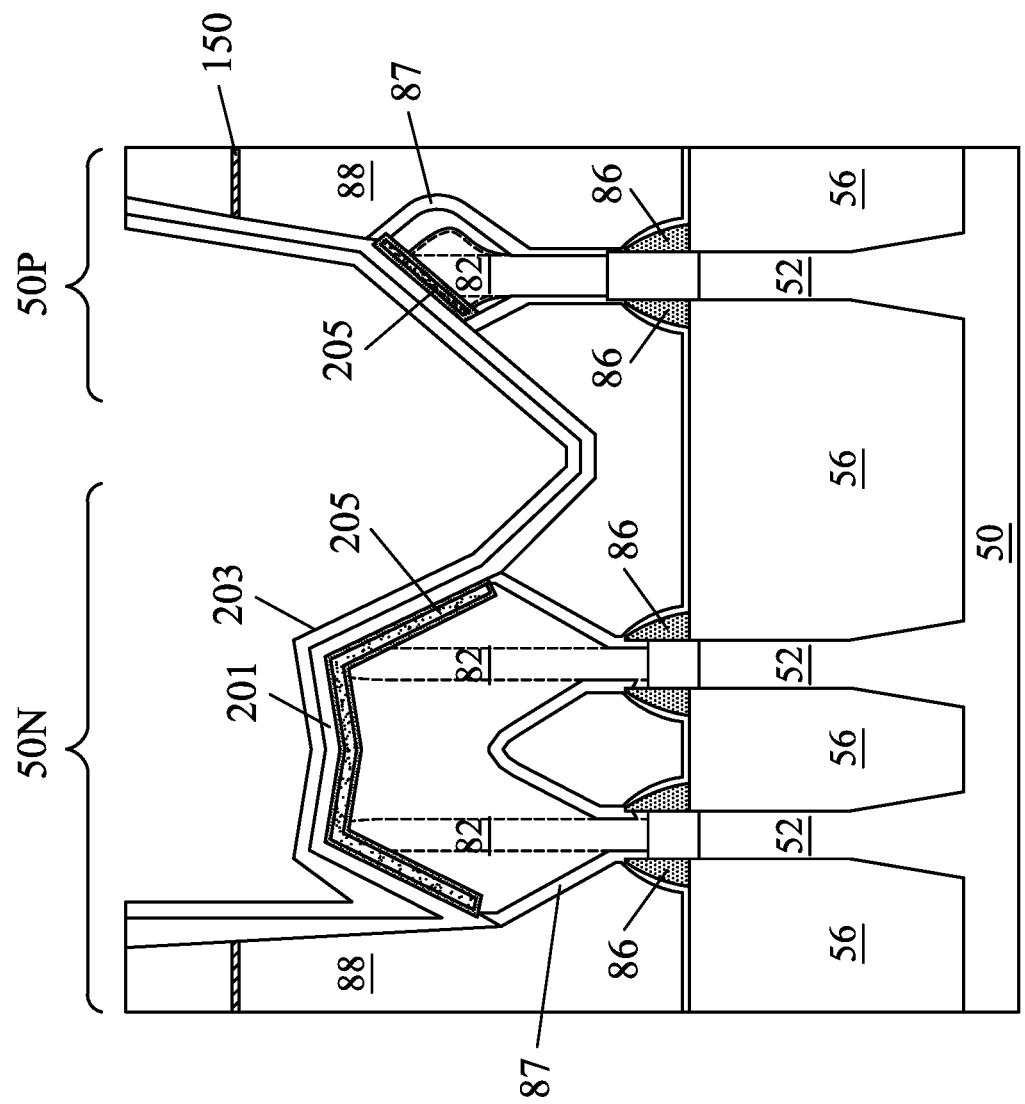

In FIGS. 17A-17C, source/drain contact openings 93 are formed through the second ILD 108, the etch stop iso, the first ILD 88, and the CESL 87. In an embodiment the source/drain contact openings 93 can be formed using one or more etching processes to sequentially etch through each of the second ILD 108, the etch stop iso, the first ILD 88 and the CESL 87. However, any suitable process or processes may be used to form the source/drain contact openings 93 and expose the source/drain regions 82.

Once the source/drain contact openings 93 have been formed and the source/drain regions 82 have been exposed, an optional pre-silicide implant may be performed in order to form a partially amorphous region and help repair any surface damage that may have occurred. For example, in some embodiments an ion such as silicon or germanium may be implanted through the source/drain contact openings 93 and into the source/drain regions 82. However, any suitable ions may be utilized.

FIGS. 17A-17C additionally illustrate a deposition of a first dual material silicide precursor layer 201 and a deposition of an oxidation barrier layer 203. In an embodiment the first dual material silicide precursor layer 201 comprises at least a first silicide precursor material and a second silicide precursor material. However, the second silicide precursor material is insoluble (e.g., less than 5%) in a first phase of a silicide formed from the first silicide precursor material while also being soluble (e.g., greater than about 10%) in a second phase of the silicide formed from the first silicide precursor material.

For example, the first silicide precursor material may be a material that is tuned for the source/drain region 82 over which it is located. For example, in an embodiment the first silicide precursor material has a relatively high Schottky barrier for placement within the region 50N, such as nickel, which has a first phase of a silicide as $Ni_2Si$ and a second phase of a silicide as NiSi. In such an embodiment, the second silicide precursor material is a material which has a low Schottky barrier to either holes/electrons and which is insoluble in the first phase (e.g., $Ni_2Si$) while also being soluble in the second phase (e.g., NiSi), such as platinum. In such an embodiment, the first dual material silicide precursor layer 201 may be an alloy layer of nickel and platinum or else may be alternating layers of nickel separated by alternating layers of platinum. However, any suitable materials may be utilized.

In an embodiment the first dual material silicide precursor layer 201 may be deposited using a deposition process such as physical vapor deposition, chemical vapor deposition, atomic layer deposition, combinations of these, or the like. Additionally, the first dual material silicide precursor layer 201 may be deposited to a thickness of between about 0.5 nm and about 10 nm. However, any suitable thickness may be utilized.

In some embodiments, the deposition process may be performed at a temperature of less than about 250° C., while still being high enough for the nickel that is being deposited to form the first phase of silicide ($Ni_2Si$) during the deposition process. As such, a first phase layer of silicide 205 is formed over the source/drain regions 82 in both the region 50N and the region 50P. The first phase layer of silicide 205 may be formed to a thickness of between about 1 nm and about 20 nm, such as about 3 nm.

Additionally, in some embodiments the first phase of silicide (e.g., $Ni_2Si$) is metal rich. For example, in an embodiment in which the first phase of silicide is $Ni_2Si$, the nickel may have a concentration of between about 55% and about 85%, such as about 65%. However, any suitable metal rich composition may be utilized.

In other embodiments the deposition process to deposit the first dual material silicide precursor layer 201 may be performed at a temperature that is too low to cause the first silicide precursor material to react, such as a temperature of less than about 250° C. In such embodiment an optional annealing process may be performed after the deposition in order to cause the formation of the first phase layer of silicide 205. In an embodiment the optional annealing process may be performed at a temperature of between about 150° C. and about 250° C., such as about 200° C., for a time period of between about 1 sec and about 100 sec, such as about 30 sec. However, any suitable temperature and time may be utilized.

However, because the second silicide precursor material is insoluble in the first phase of silicide that is present in the first phase layer of silicide 205, the second silicide precursor material (e.g., platinum) will not diffuse into the first phase layer of silicide 205 and will not react to form a silicide of its own. As such, the second silicide precursor material is effectively limited to being only within the first dual material silicide precursor layer 201 at this stage of manufacturing.

Once the first dual material silicide precursor layer 201 has been formed, the optional oxidation barrier layer 203 may be deposited over the first dual material silicide precursor layer 201 in order to help protect the first dual material silicide precursor layer 201 during subsequent processing. In an embodiment the oxidation barrier layer 203 may be a material such as titanium, tungsten, tantalum or ruthenium, which may be deposited to a thickness of between about 2 nm and about 10 nm, such as about 4 nm using such deposition processes as physical vapor deposition, chemical vapor deposition, atomic layer deposition, combinations of these, or the like. However, any suitable material, thickness or processes may be utilized.

Figure 18:
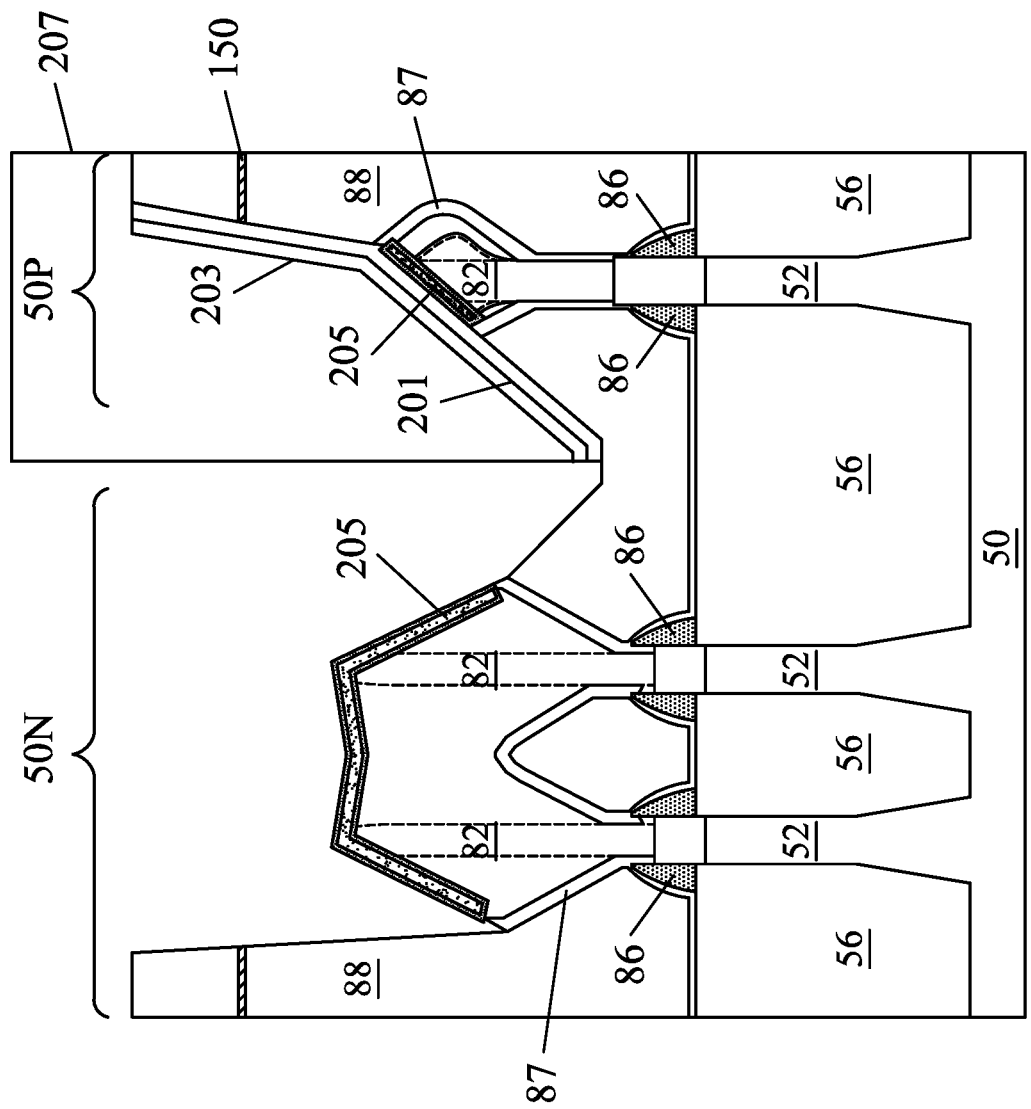
FIG. 18 illustrates a partial removal of the first dual material silicide precursor layer in accordance with some embodiments.

FIG. 18 (which shows a cut along reference cross-section C-C illustrated in FIG. 1) illustrates a patterning of the first dual material silicide precursor layer 201 to remove the first dual material silicide precursor layer 201 from the region 50N while retaining the first dual material silicide precursor layer 201 within the region 50P. In an embodiment the first dual material silicide precursor layer 201 may be patterned by initially applying a photoresist layer 207 (e.g., a trilayer photoresist) over the first dual material silicide precursor layer 201, exposing a photosensitive material within the photoresist layer 207 to a patterned light source, developing the photosensitive material to remove a portion of the photosensitive material over the region 50N, and then using the photosensitive material as a mask to remove the other layers of the photoresist layer 207 and expose the material of the oxidation barrier layer 203 and the first dual material silicide precursor layer 201 in the region 50N.

Once the photoresist layer 207 has been patterned, the photoresist layer 207 may be used as a mask to protect portions of the first dual material silicide precursor layer 201 in the region 50P while removing portions of the oxidation barrier layer 203 and the first dual material silicide precursor layer 201 in the region 50N. In an embodiment the removal may be performed using, e.g., one or more anisotropic etching processes such as a reactive ion etch to remove the exposed portions of the oxidation barrier layer 203 and the first dual material silicide precursor layer 201 within the region 50N. However, any suitable process may be utilized.

However, while the oxidation barrier layer 203 and the first dual material silicide precursor layer 201 are removed within the region 50N, the first phase layer of silicide 205 within the region 50N is not removed. Additionally, the oxidation barrier layer 203, the first dual material silicide precursor layer 201, and the first phase layer of silicide 205 that are located within the region 50P also remain after the patterning process.

Figure 19A:
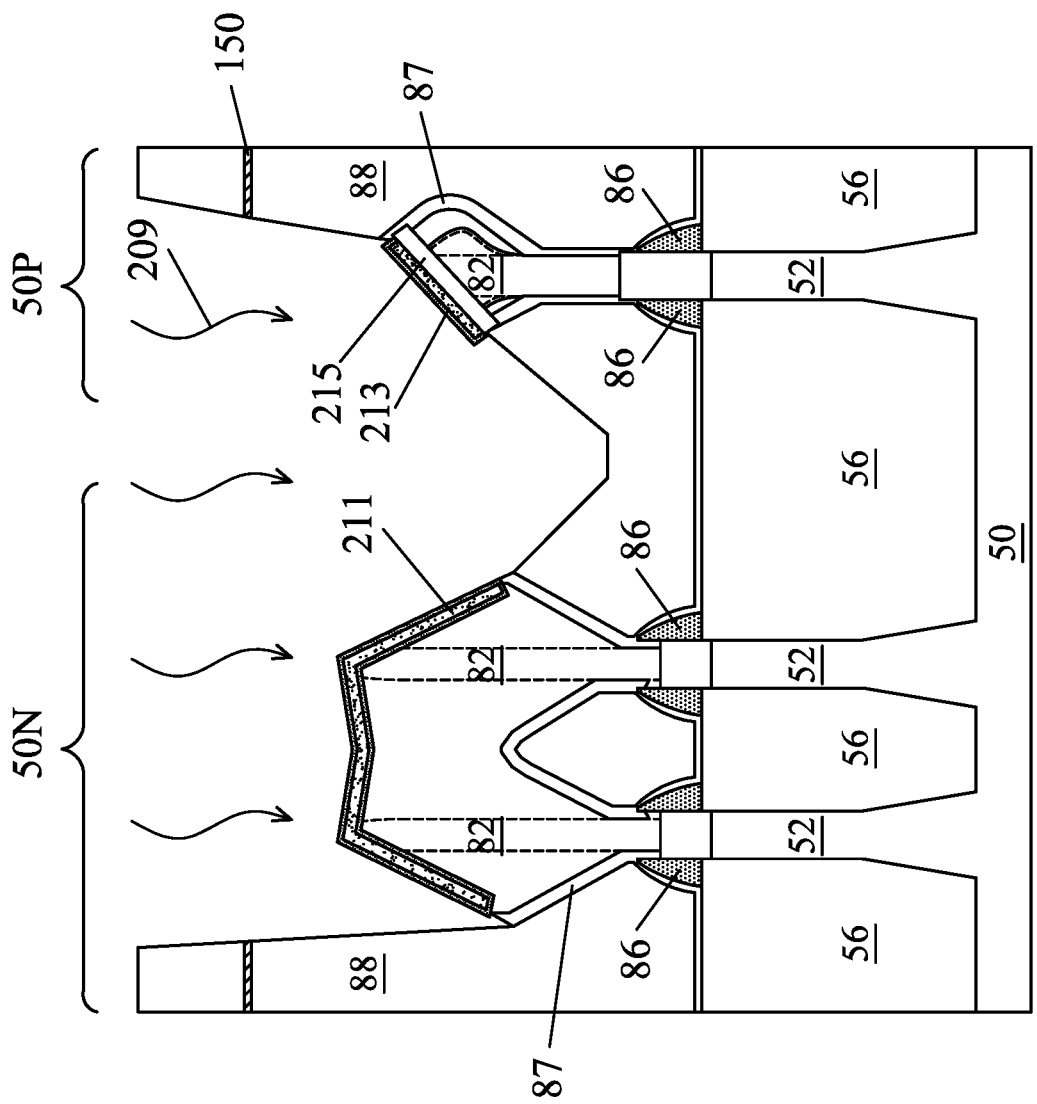
FIGS. 19A and 19B illustrate an annealing process in accordance with some embodiments.

FIG. 19A (which shows a cut along reference cross-section C-C illustrated in FIG. 1) illustrates that, once the first dual material silicide precursor layer 201 has been removed from the region 50N, an annealing process (represented in FIG. 19A by the wavy lines labeled 209) may be performed to shift the phase of the first phase layer of silicide 205 into another phase. In a particular embodiment the annealing process 209 may be a rapid thermal anneal that is performed at a temperature that is higher than the deposition temperature of the first dual material silicide precursor layer 201, such as by being between about 400° C. and about 450° C. for a time of between about <1 s and about 60 s, such as about 30 s, although any suitable temperature and time may be utilized. However, any suitable annealing process, such as a milli-second laser anneal, a flash anneal, a spike anneal, or a conventional soak anneal, may be utilized.

By utilizing such a temperature, the phase of the first phase layer of silicide 205 that is located within the region 50N may be shifted to a second phase of the same material. For example, in an embodiment in which the first phase layer of silicide 205 is originally formed as $Ni_2Si$, the annealing process 209 may shift the phase of this material to NiSi. As such, a second phase layer of silicide 211 may be formed in the region 50N.

Additionally, in some embodiments the second phase layer of silicide 211 is semiconductor rich, such as by being silicon rich, germanium rich, or III-V material rich. For example, in an embodiment in which the second phase of silicide is NiSi, the silicon may have a concentration of between about 35% and about 65%, such as about 50%. However, any suitable semiconductor rich composition may be utilized.

Additionally, in the region 50P, a similar phase change is occurring with the first phase layer of silicide 205 because of the annealing process 209. In particular, in an embodiment in which the first phase layer of silicide 205 was deposited as $Ni_2Si$, the $Ni_2Si$ will undergo a phase change to NiSi. However, with the change in phase from the first phase of material (e.g., $Ni_2Si$) to the second phase of material (NiSi), the second silicide precursor (e.g., platinum) is no longer blocked from diffusing and reacting because the second silicide precursor is now soluble in the material. In particular, in an embodiment in which the first silicide precursor is nickel and the second silicide precursor is platinum, the annealing process 209 will change the phase of the $Ni_2Si$ in the first phase layer of silicide 205 (in which the platinum is insoluble) to a second phase such as NiSi in which the platinum is soluble.

Given the change in solubility, the second silicide precursor (e.g., platinum) will begin to diffuse and react to form a third phase layer of silicide 213 with the first silicide precursor (e.g., nickel) and the material of the source/drain region 82. As such, the third phase layer of silicide 213 will include not only the first silicide precursor and the silicon from the source/drain region 82, but also the material of the second silicide precursor. In an embodiment in which the first silicide precursor is nickel and the second silicide precursor is platinum, the third phase layer of silicide 213 is NiPtSi. However, any suitable materials may be formed.

Additionally, in some embodiments the second silicide precursor (e.g., platinum) may move through the third phase layer of silicide 213 in order to react with previously unreacted material of the source/drain region 82. As such, the second silicide precursor may actually self-segregate from the third phase layer of silicide 213 to form a segregated silicide layer 215 between the third phase layer of silicide 213 and the remainder of the source/drain region 82 within the region 50P. In an embodiment the segregated silicide layer 215 may have a thickness of between about 0.5 nm and about 4 nm, such as about 2 nm. However, any suitable thickness may be utilized.

Figure 19B:
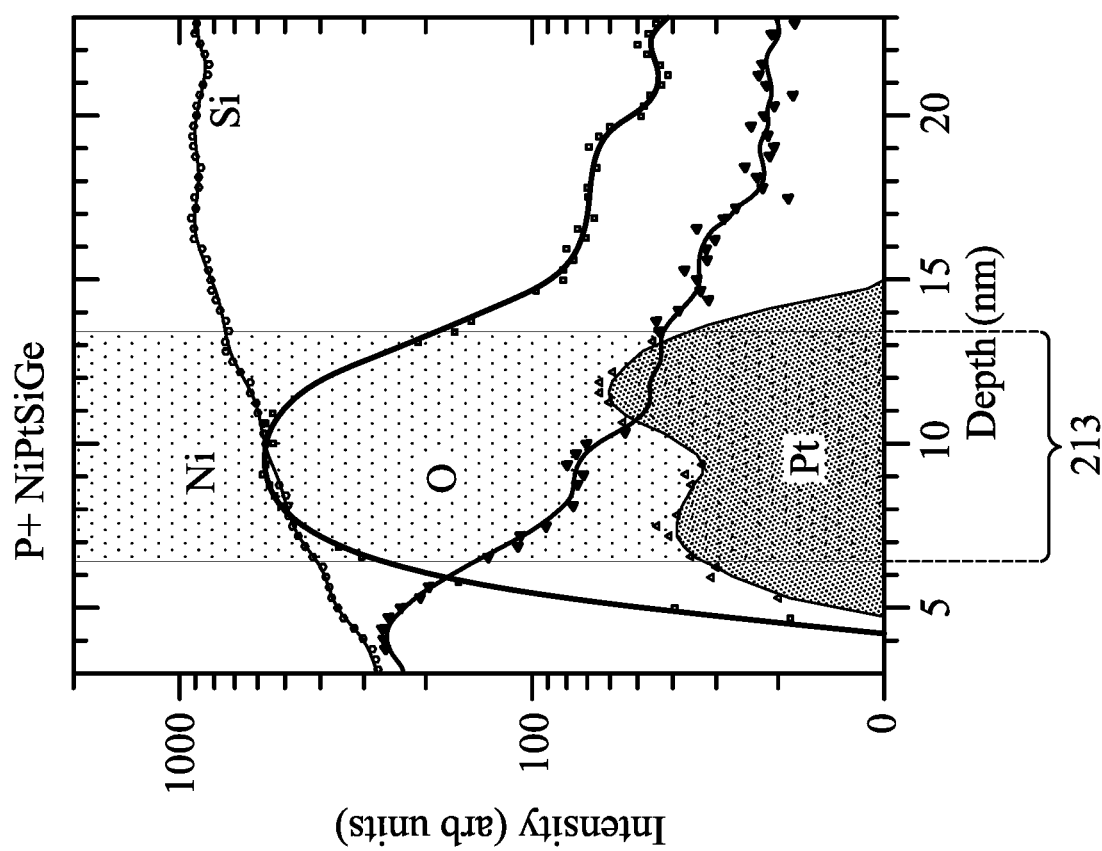

FIG. 19B illustrates a relative intensity of elements in one embodiment in which the first precursor material is nickel, the second precursor material is platinum, and the source/drain region 82 is silicon germanium. As can be seen, the nickel and platinum form the third phase layer of silicide 213 along with the silicon, with the platinum extending all of the way through the third phase layer of silicide 213.

FIG. 19A additionally illustrates that, once the third phase layer of silicide 213 has been formed, the oxidation barrier layer 203 may be selectively removed. In an embodiment the oxidation barrier layer 203 may be removed using an etching process such as a wet etching process or dry etching process that utilizes etchants that are selective to the material of the oxidation barrier layer 203 (e.g., titanium). However, any suitable etching process may be utilized.

Once the oxidation barrier layer 205 has been removed, any unreacted material of the first dual material silicide precursor layer 201 that has not yet been removed or reacted is removed. In an embodiment the first dual material silicide precursor layer 201 may be removed using an etching process such as a wet etching process or dry etching process that utilizes etchants that are selective to the materials of the first dual material silicide precursor layer 201 (e.g., nickel and platinum). However, any suitable etching process may be utilized.

Figure 20:
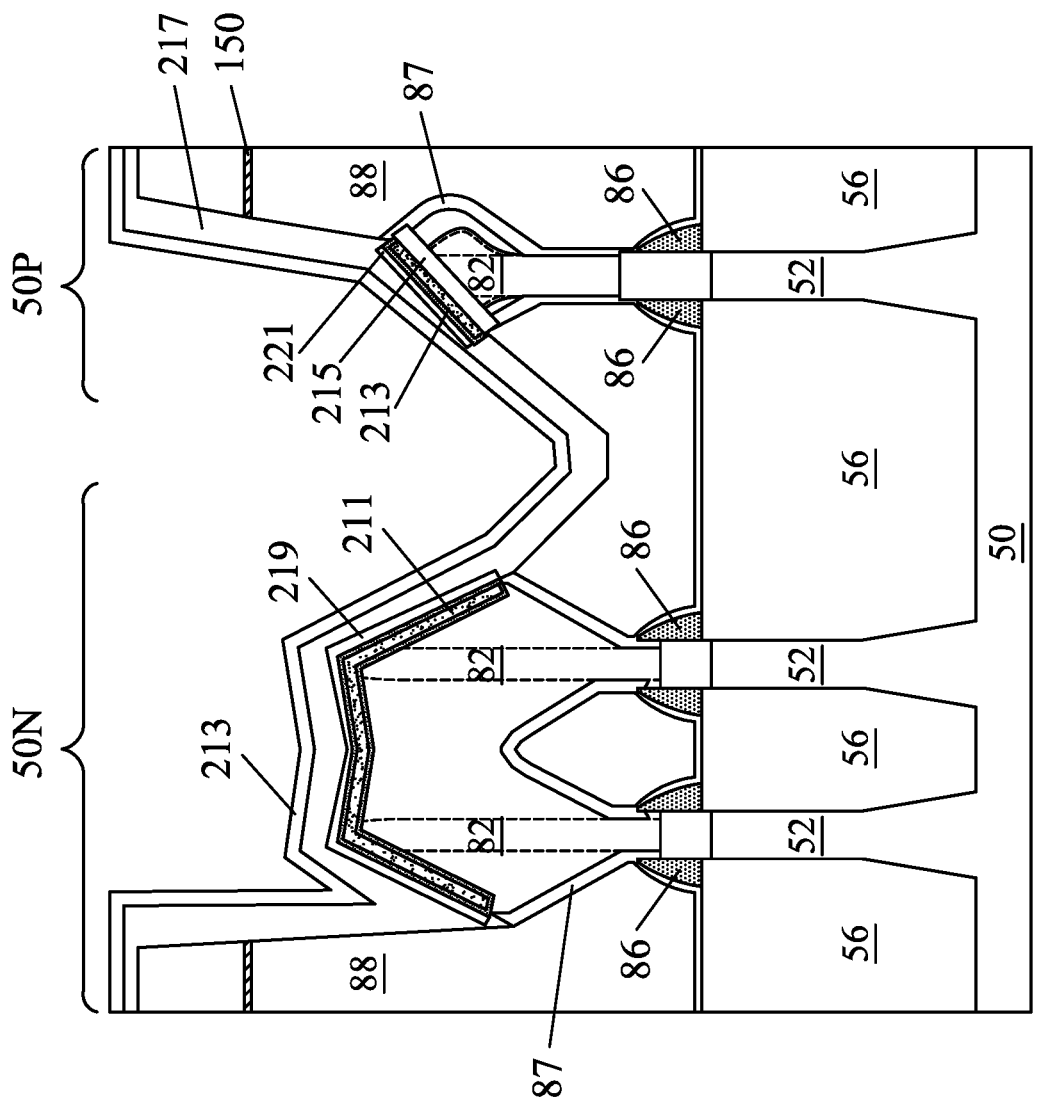
FIG. 20 illustrates a deposition of a glue layer in accordance with some embodiments.

FIG. 20 (which shows a cut along reference cross-section C-C illustrated in FIG. 1) illustrates that, once the oxidation barrier layer 203 and the unreacted portions of the first dual material silicide precursor layer 201 have been removed, a glue layer 217 may be deposited in preparation for formation of a contact 233. In an embodiment, an optional cleaning process may be performed prior to formation of the glue layer 217 in order to remove any oxides that may be present after the various etching processes have been completed. The cleaning process in some embodiments uses a hydrogen pre-clean treatment (e.g., hydrogen ($H_2$) plasma treatment, or the like) to remove waste and any oxides from the surfaces. However, any suitable cleaning process may be utilized.

Once clean, the glue layer 217 may be deposited in order to help overlying layers adhere to underlying layers. In some embodiments the glue layer 217 may be a material such as titanium, tungsten, or tantalum, which is deposited using a deposition process such as chemical vapor deposition, physical vapor deposition, or atomic layer deposition to a thickness of between about 1 nm and about to nm, such as about 5 nm. However, any suitable material, deposition process, and thickness may be utilized.

Additionally, in some embodiments the deposition process of the glue layer may be performed at a temperature at which the material of the glue layer 217 (e.g., titanium) will react during the deposition process with the underlying materials to form a first glue silicide layer 219 over the second phase layer of silicide 211. In an embodiment in which the glue layer 217 is titanium, the deposition process may be performed at a deposition temperature of between about 400° C. and about 600° C., although any suitable temperature may be utilized.

At these temperatures, the material of the glue layer 217 may react with exposed materials to form additional silicides. For example, in the region 50N, the material of the glue layer 217 reacts with the second phase layer of silicide 211 to form a first glue silicide layer 219 over the second phase layer of silicide 211. In an embodiment in which the glue layer 217 is titanium and the second phase layer of silicide 211 is NiSi, the first glue silicide layer 219 may be formed to be TiNiSi alloy formed to have a thickness of between about 2 nm and about 20 nm, such as about 8 nm. However, any suitable thickness may be utilized.

Similarly, in the region 50P the material of the glue layer 217 (e.g., titanium) will react with silicon from the material of the third phase layer of silicide 213 to form a second glue silicide layer 221. In an embodiment in which the glue layer 217 is titanium, the second glue silicide layer 221 will react to form a silicide such as titanium silicide over the third phase layer of silicide 213. In an embodiment the second glue silicide layer 221 may be formed to have a thickness of between about 1 nm and about to nm, such as about 5 nm. However, any suitable thickness may be utilized.

FIG. 20 additionally illustrates that, once the glue layer 217 has been formed, a barrier layer 223 may be deposited over the glue layer 217. In an embodiment, the barrier layer 223 may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the barrier layer 223 may be deposited using a deposition process such as atomic layer deposition, chemical vapor deposition, sputtering, or the like, to a thickness of between about 5 Å and about 200 Å, although any suitable deposition process or thickness may be used.

Once the barrier layer 223 has been formed, and in embodiments in which the deposition process to deposit the glue layer 217 is performed at a temperature that is too low to cause the glue layer 217 to react, an optional annealing process may be performed in order to cause the formation of the first glue silicide layer 219 and the second glue silicide layer 221. In an embodiment the optional annealing process may be performed at a temperature of between about 350° C. and about 600° C., such as about 500° C., for a time period of between about 1 msec and about 60 sec, such as about 30 sec. However, any suitable temperature and time may be utilized.

Figure 21:
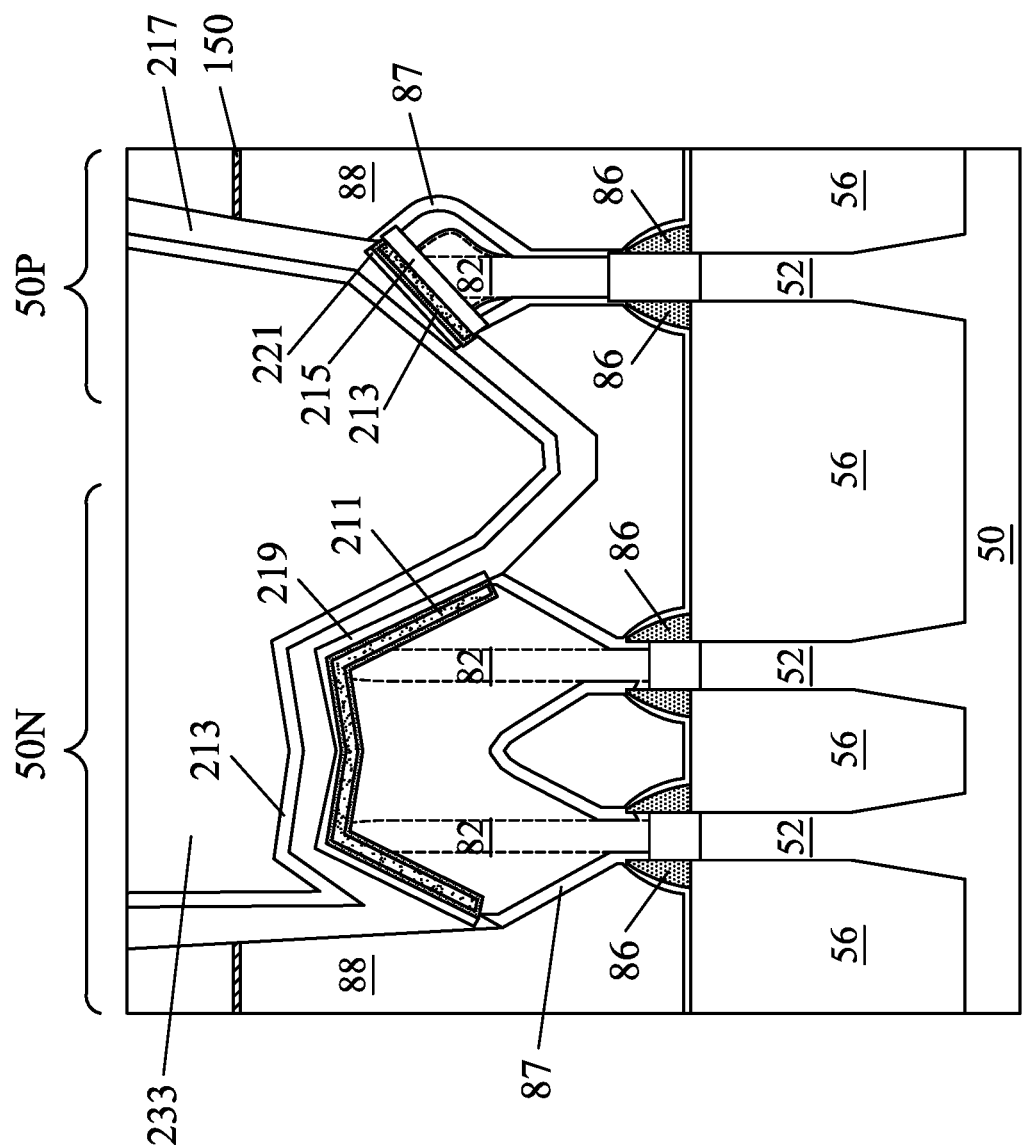
FIG. 21 illustrates a formation of a contact in accordance with some embodiments.

FIG. 21 (which shows a cut along reference cross-section C-C illustrated in FIG. 1) illustrates formation of a first contact 233. In an embodiment the first contact 233 may be a conductive material such as W, Al, Cu, Co, Ti, Ta, Ru, TiN, TiAl, TiAlN, TaN, TaC, NiSi, CoSi, combinations of these, or the like, although any suitable material may be deposited using a deposition process such as sputtering, chemical vapor deposition, electroplating, electroless plating, or the like, to fill and/or overfill the opening. Once filled or overfilled, any deposited material outside of the opening may be removed using a planarization process such as chemical mechanical polishing (CMP). However, any suitable material and process of formation may be utilized.

By utilizing the embodiments described herein, the materials of the silicides may be tuned to the devices each one is put into instead of using a single Schottky barrier which cannot be catered separately for N+ and P+ contacts. For example, the silicide materials for N-type devices (within, e.g., the region 50N) are tuned for an N-type device while the silicide materials for P-type devices (within, e.g., the region 50P) are tuned for a P-type device. As such, for contacts to P+ devices, a reduction in the P+ Schottky barrier can be reduced greater than about 25%. Additionally, there is also an increase in the effective silicide area due to the outward diffusion characteristics materials, which results in a reduction in both N+ and P+ contact resistances, as well as improved dopant concentrations from dopant segregation in faster diffusivity metals because of the snowplow and low solid solubility.

In accordance with an embodiment, a method of manufacturing a semiconductor device, the method including: depositing a first silicide precursor and a second silicide precursor on a source/drain region, wherein the depositing also forms a first silicide with a first phase, the second silicide precursor being insoluble within the first phase of the first silicide; changing the first phase of the first silicide to a second phase of the first silicide, the second silicide precursor being soluble within the second phase of the first silicide; and forming a second silicide with the second silicide precursor and the second phase of the first silicide. In an embodiment, the forming the second silicide also forms a segregated region between the second silicide and a remaining portion of the source/drain region. In an embodiment, the first silicide precursor includes nickel. In an embodiment, the second silicide precursor includes platinum. In an embodiment, the method further includes removing a portion of the first silicide precursor and the second silicide precursor prior to the changing the first phase of the first silicide to the second phase of the first silicide. In an embodiment, the portion of the first silicide precursor and the second silicide precursor is located over an N+ source/drain region prior to the removing the portion of the first silicide precursor and the second silicide precursor. In an embodiment, the second silicide is located over a P+ source/drain region.

In accordance with another embodiment, a method of manufacturing a semiconductor device, the method including: forming a first source/drain region adjacent to a first gate stack; forming a second source/drain region adjacent to a second gate stack; depositing a first material layer onto both the first source/drain region and the second source/drain region, the first material layer includes a first silicide precursor and a second silicide precursor; forming a first silicide on both the first source/drain region and the second source/drain region, wherein the forming the first silicide forms the first silicide with the first silicide precursor but not with the second silicide precursor, the first silicide having a first phase; removing the first silicide precursor and the second silicide precursor from the first source/drain region without removing the second silicide precursor from the second source/drain region; and changing the first phase of the first silicide to a second phase of the first silicide. In an embodiment, the second silicide precursor is insoluble in the first phase of the first silicide. In an embodiment, the second silicide precursor diffuses into the second phase to form a third silicide during the changing the first phase of the first silicide. In an embodiment, the method further includes forming a fourth silicide over the third silicide. In an embodiment, the forming the fourth silicide includes depositing titanium. In an embodiment, the forming the fourth silicide further includes performing an annealing process separate from the depositing the titanium. In an embodiment, the forming the first silicide includes performing an annealing process separate from the depositing the first material layer.

In accordance with yet another embodiment, a semiconductor device includes: a first source/drain region separated from a second source/drain region; a first silicide on the first source/drain region, the first silicide including a first set of elements; a second silicide on the second source/drain region, the second silicide including the first set of elements and a first element, wherein the first element is insoluble in a first phase of a silicide including the first set of elements and soluble in a second phase of the silicide including the first set of elements. In an embodiment, the first set of elements includes nickel and silicon. In an embodiment, the first element is platinum. In an embodiment, the semiconductor device further includes a segregated silicide between the second silicide and the second source/drain region, the segregated silicide including the first element. In an embodiment, the semiconductor device further includes a third silicide over the second silicide, the third silicide including a different material than the second silicide. In an embodiment, the third silicide includes titanium The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing nickel and platinum on a source/drain region within a semiconductor fin, wherein the depositing forms a metal-rich silicide with a metal-rich phase, the platinum being insoluble within the metal-rich phase of the metal-rich silicide;
    masking a first portion of the nickel and the platinum;
    removing a second portion of the nickel and the platinum exposed by the mask;
    annealing the metal-rich silicide to change the metal-rich phase of the metal-rich silicide to a semiconductor-rich phase, the platinum being soluble within the semiconductor-rich phase; and
    forming a second silicide with the platinum and the semiconductor-rich phase.

2. The method of claim 1, wherein after the depositing the nickel and platinum, the metal-rich silicide has a thickness of between about 1 nm and about 20 nm.

3. The method of claim 2, wherein after the depositing the nickel and platinum, the metal-rich silicide has a thickness of between about 1 nm and about 3 nm.

4. The method of claim 1, further comprising, prior to the depositing the nickel and the platinum:
    exposing the source/drain region; and
    performing a pre-silicide implant.

5. The method of claim 4, wherein the pre-silicide implant implants silicon.

6. The method of claim 1, wherein the masking the first portion comprises depositing an oxidation barrier layer.

7. The method of claim 6, wherein the depositing the oxidation barrier layer deposits the oxidation barrier layer to a thickness of between about 2 nm and about 10 nm.

8. A method of manufacturing a semiconductor device, the method comprising:
    forming source/drain contact openings through a dielectric layer;
    depositing a dual material silicide precursor layer, the dual material silicide precursor layer comprising a first material and a second material different from the first material, the depositing forming a first phase of a first silicide from the first material, the second material being insoluble in the first phase;
    depositing an oxidation barrier layer over the dual material silicide precursor layer;
    removing a first portion of the dual material silicide precursor layer through the oxidation barrier layer while leaving a second portion of the dual material silicide precursor layer; and
    modifying the second portion of the dual material silicide precursor layer to a second phase of the first silicide, the second material being soluble in the first phase.

9. The method of claim 8, wherein the depositing the oxidation barrier layer deposits titanium.

10. The method of claim 8, wherein the depositing the oxidation barrier layer deposits tungsten.

11. The method of claim 8, wherein the depositing the oxidation barrier layer deposits ruthenium.

12. The method of claim 8, wherein the depositing the oxidation barrier layer deposits the oxidation barrier layer to a thickness of between about 2 nm and about 4 nm.

13. The method of claim 8, wherein the modifying the second portion forms a segregated silicide layer with a thickness of between about 0.5 nm and about 4 nm.

14. The method of claim 13, wherein the segregated silicide layer comprises platinum.

15. A method of manufacturing a semiconductor device, the method comprising:
    exposing a first semiconductor region and a second semiconductor region through a dielectric layer;
    depositing a plurality of precursors on both the first semiconductor region and the second semiconductor region;
    annealing the plurality of precursors to react at least a first one of the plurality of precursors with respective ones of the first semiconductor region and the second semiconductor region, wherein at least a second one of the plurality of precursors is insoluble in a product of the reaction;
    removing a first portion of the plurality of precursors through a mask while leaving a second portion of the plurality of precursors; and
    modifying a solubility of the product of the reaction within the second portion of the plurality of precursors until the second one of the plurality of precursors is soluble within the product of the reaction.

16. The method of claim 15, wherein the mask is a photoresist.

17. The method of claim 15, wherein the modifying the solubility forms a segregated silicide layer.

18. The method of claim 17, wherein the segregated silicide layer has a thickness of between about 0.5 nm and about 2 nm.

19. The method of claim 18, wherein the segregated silicide layer comprises platinum.

20. The method of claim 15, wherein the product is $Ni_2Si$.

* * * * *